(12) United States Patent
Uchida et al.

(10) Patent No.: US 10,861,897 B2
(45) Date of Patent: Dec. 8, 2020

(54) IMAGING DEVICE AND IMAGING SYSTEM

(71) Applicant: CANON KABUSHIKI KAISHA, Tokyo (JP)

(72) Inventors: Takeshi Uchida, Hiratsuka (JP); Jun Iba, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/526,168

(22) Filed: Jul. 30, 2019

(65) Prior Publication Data

US 2019/0355776 A1   Nov. 21, 2019

Related U.S. Application Data

(63) Continuation of application No. PCT/JP2018/003189, filed on Jan. 31, 2018.

(30) Foreign Application Priority Data

Feb. 7, 2017   (JP) ................. 2017-020334

(51) Int. Cl.
*H01L 27/146*   (2006.01)
*H01L 27/148*   (2006.01)
(Continued)

(52) U.S. Cl.
CPC .. *H01L 27/14643* (2013.01); *H01L 27/14812* (2013.01); *H04N 5/374* (2013.01); *H01L 31/12* (2013.01)

(58) Field of Classification Search
CPC ......... H01L 27/14643; H01L 27/14812; H01L 31/12; H01L 27/156; H01L 25/167; H01L 27/14; H01L 27/146; H04N 5/374
See application file for complete search history.

(56) References Cited

U.S. PATENT DOCUMENTS 5,093,879 A   3/1992  Bregman
5,567,955 A   10/1996 Liu
(Continued)

FOREIGN PATENT DOCUMENTS

JP    55-26615   2/1980
JP    5-21837    1/1993
(Continued)

OTHER PUBLICATIONS

International Search Report dated Aug. 22, 2019 issued during prosecution of related International Application No. PCT/JP2018/003189. (Whole English-language translation included.).

(Continued)

*Primary Examiner* — Mohammed R Alam
(74) *Attorney, Agent, or Firm* — Venable LLP

(57) ABSTRACT

An imaging device includes a first substrate in which a plurality of first pixels each including a first light receiving unit and a light emitting unit that emits light with a light amount in accordance with a light amount detected by the first light receiving unit are provided, and a second substrate that is provided facing the first substrate and in which a plurality of second pixels each including a second light receiving unit that detects a light emitted from the light emitting unit of the first pixel and a readout circuit that outputs an image signal based on information detected by the plurality of second pixels are provided.

17 Claims, 16 Drawing Sheets

(51) Int. Cl.
  *H04N 5/374*    (2011.01)
  *H01L 31/12*    (2006.01)

(56)         References Cited

U.S. PATENT DOCUMENTS

| | | | |
|---|---|---|---|
| 8,367,452 | B2 | 2/2013 | Soma |
| 9,261,769 | B2 | 2/2016 | Tashiro |
| 9,831,278 | B2 | 11/2017 | Kato |
| 10,008,528 | B2 | 6/2018 | Ikahura |
| 10,225,496 | B2 | 3/2019 | Ogura |
| 2005/0083567 | A1 | 4/2005 | Chun Liu |
| 2011/0079765 | A1* | 4/2011 | Soma .................... H01L 31/107 |
| | | | 257/13 |
| 2015/0137148 | A1* | 5/2015 | Wong .................... H01L 25/167 |
| | | | 257/82 |
| 2016/0247846 | A1 | 8/2016 | Iida |
| 2016/0334621 | A1 | 11/2016 | Kawabata |

FOREIGN PATENT DOCUMENTS

| | | |
|---|---|---|
| JP | 5-40214 | 2/1993 |
| JP | 5-335375 | 12/1993 |
| JP | 6-97490 | 4/1994 |
| JP | 2005-251878 | 9/2005 |
| JP | 2011-77467 | 4/2011 |
| JP | 2011-142558 | 7/2011 |
| JP | 2016-118417 | 6/2016 |

OTHER PUBLICATIONS

International Search Report dated Mar. 20, 2018 issued by the JPO in International Application No. PCT/JP2018/003189.

* cited by examiner

IMAGING DEVICE AND IMAGING SYSTEM

CROSS-REFERENCE TO RELATED APPLICATIONS

This application is a Continuation of International Patent Application No. PCT/JP2018/003189, filed Jan. 31, 2018, which claims the benefit of Japanese Patent Application No. 2017-020334, filed Feb. 7, 2017, both of which are hereby incorporated by reference herein in their entirety.

BACKGROUND OF THE INVENTION

Field of the Invention

The present invention relates to an imaging device and an imaging system.

Description of the Related Art

As an imaging device that acquires an image of a wavelength band above 1.0 μm, Japanese Patent Application Laid-Open No. H05-335375 discloses an imaging device having a configuration in which a first substrate provided with a photodiode array and a second substrate provided with a functional element used for performing signal processing are connected to each other by metal bumps. This imaging device is manufactured by fabricating the first substrate and the second substrate by wafer processes, respectively, and then electrically and mechanically connecting the first substrate and the second substrate by using metal bumps of indium (In) or the like.

The first substrate outputs signals, and the number of signals is the same as that of photodiodes forming the photodiode array. The second substrate has a function of converting an output signal from the first substrate into an image signal and performing electrical output in accordance with the number of electrode pins that may be accommodated in a general package. Thus, with a module being formed of only the first substrate, the number of electrode pins from which signals are picked out will be numerous, which is difficult to be used as an imaging device in the actual practice. In terms of the above, not only the first substrate provided with a photodiode array but also the second substrate provided with a function element is included to form a module, and an imaging device is formed.

In the imaging device formed of the first substrate provided with a photodiode array and the second substrate provided with a functional element, however, there are various constraints in terms of performance, cost, or the like due to the connection form between the first substrate and the second substrate.

SUMMARY OF THE INVENTION

An object of the present invention is to provide a high-performance and reliable imaging device and a high-performance and reliable imaging system that include a substrate in which a light receiving unit is provided and a substrate in which a readout circuit is provided.

According to one aspect of the present invention, there is provided an imaging device including a first substrate in which a plurality of first pixels each including a first light receiving unit and a light emitting unit that emits light with a light amount in accordance with a light amount detected by the first light receiving unit are provided, and a second substrate that is provided facing the first substrate and in which a plurality of second pixels each including a second light receiving unit that detects a light emitted from the light emitting unit of the first pixel and a readout circuit that outputs an image signal based on information detected by the plurality of second pixels are provided.

Further features of the present invention will become apparent from the following description of exemplary embodiments with reference to the attached drawings.

DESCRIPTION OF THE EMBODIMENTS

Figure 1:
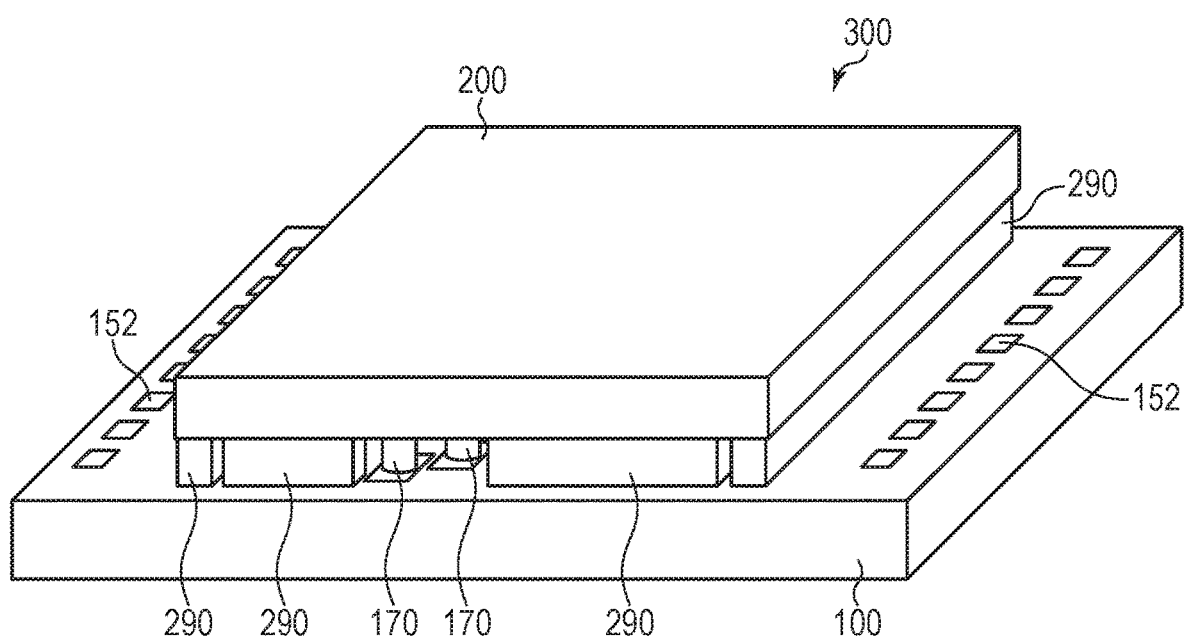
FIG. 1 is a schematic perspective view illustrating the structure of an imaging device according to a first embodiment of the present invention.

As described previously, there are various constraints in performance, manufacturing cost, or the like in an imaging device in a form in which a first substrate provided with a photodiode array and a second substrate provided with a functional element are connected to each other by metal bumps.

For example, when heating during connection by metal bumps, there may be a constraint in the area of a sensor unit due to the difference between the thermal expansion coefficient of the first substrate and the thermal expansion coefficient of the second substrate. A compound semiconductor substrate is typically used as the first substrate, and a silicon substrate is typically used as the second substrate. For example, when an InP substrate is used as the first substrate and a silicon substrate is used as the second substrate, with the width of the substrate being around 30 mm, a difference in a change of length due to thermal expansion will be around 20 μm for some heating conditions. Since this difference corresponds to a size corresponding to the general size of a pixel, it is difficult to achieve bump connection under such conditions.

Further, there may be a constraint in the size of a pixel. When the first substrate and the second substrate are in an ideal state where there is no warping, a low height of the metal bump does not cause any problem in joining, however, there is warping in fact to some degrees in both the substrates. When such substrates are joined, an in-plane distribution in the gap between the substrates in accordance with warping of the substrates may occur. Thus, a clearance width in accordance with a difference in the gaps is required to be provided to the height of the metal bump electrically connecting the first substrate and the second substrate to each other, and as a result, a certain height is required for the metal bump. On the other hand, there is a limit in the aspect ratio (a ratio of a lateral width and a height) of the metal bump, and the lateral width of the metal bump cannot be narrower than a limit value of the aspect ratio. As a result, the size of a pixel is restricted by the size of the metal bump and cannot be reduced to a certain size or smaller.

Further, a yield of a joining process of substrates by using the metal bump is not so high as a yield of a silicon wafer process in general. Thus, a yield of imaging devices in which the first substrate and the second substrate are connected by using the metal bump is affected by a yield of a joining process and may often be lower than a yield of imaging devices formed only of silicon and configured to acquire an image in a visible light band.

Some embodiments of the present invention that may solve the above problems will be described below. Note that the present invention is not limited to only the embodiments described below. For example, a modified example in which a part of the configuration of the embodiment described below is changed within a scope not departing from the spirit of the present invention is also one of the embodiments of the present invention. Further, a form in which a part of the configuration of any of the embodiments described below is added to another embodiment or a form in which a part of the configuration of any of the embodiments is replaced with a part of the configuration of another embodiment is one of the embodiments of the present invention.

First Embodiment

Figure 2A:
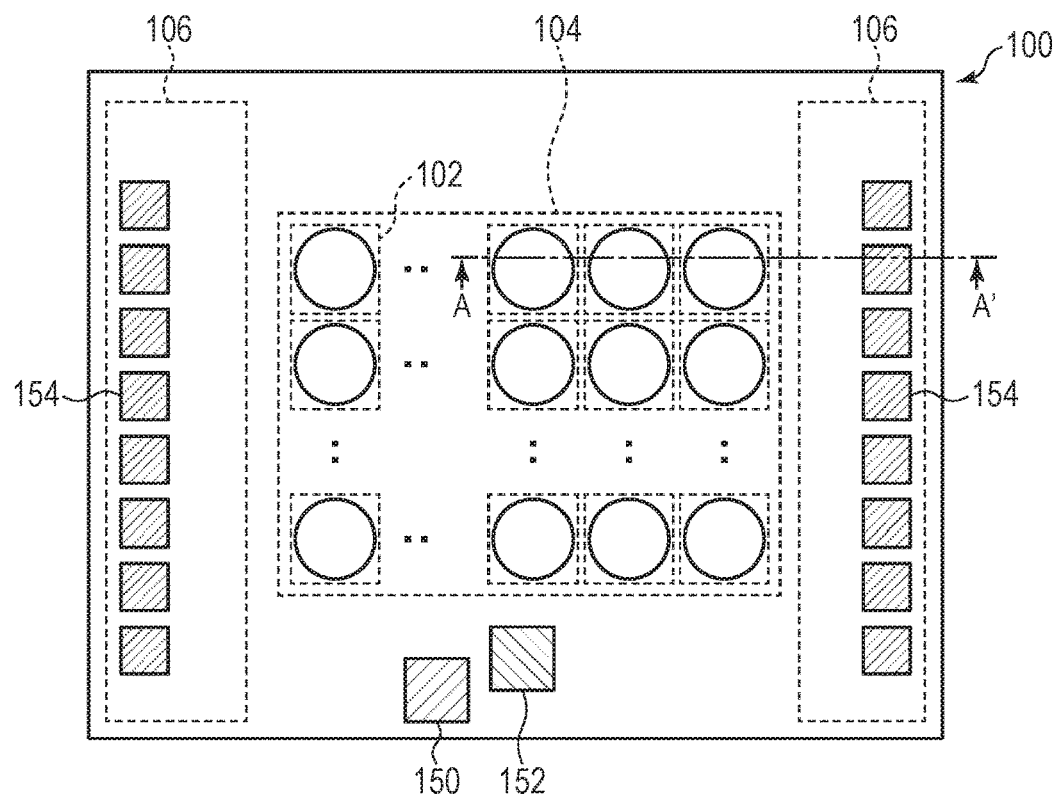
FIG. 2A is a diagram illustrating one example of a plan layout of a readout circuit substrate forming the imaging device according to the first embodiment of the present invention.
Figure 2B:
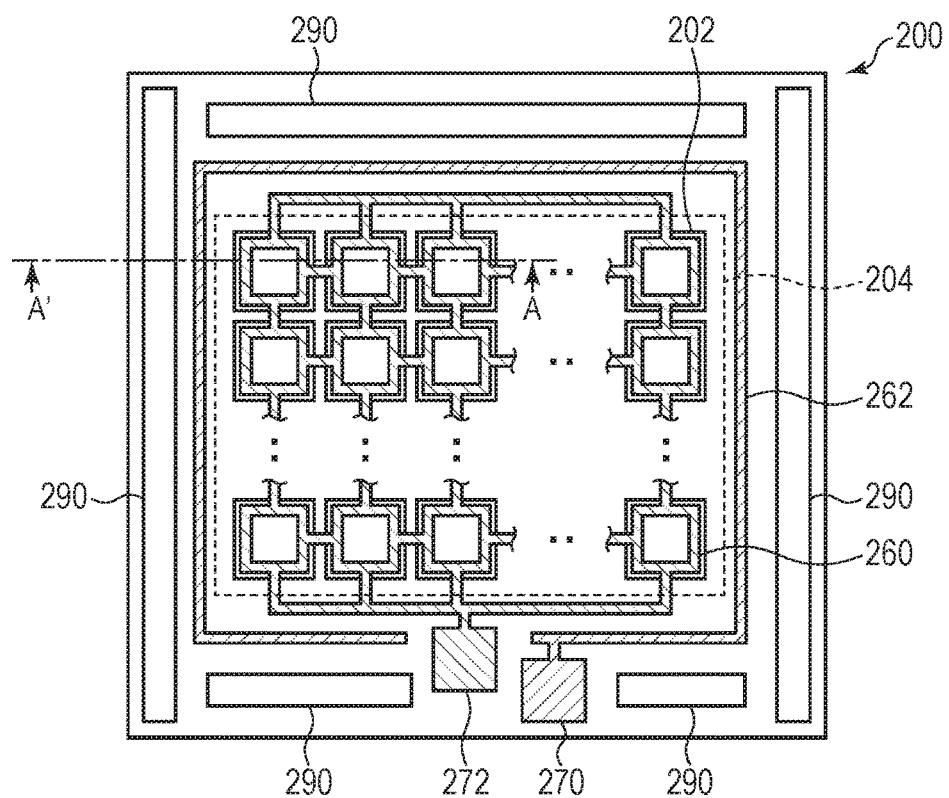
FIG. 2B is a diagram illustrating one example of a plan layout of a sensor substrate forming the imaging device according to the first embodiment of the present invention.
Figure 3:
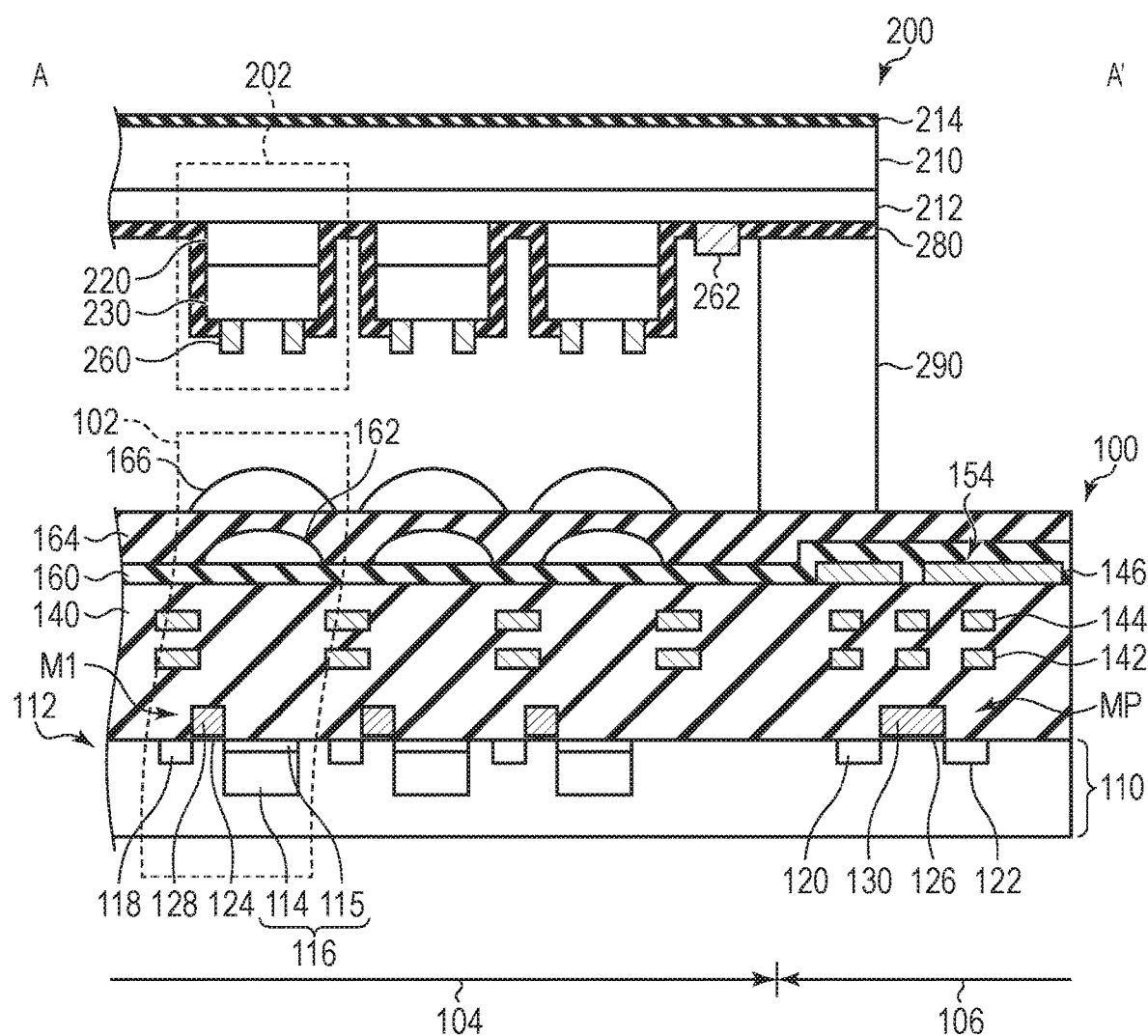
FIG. 3 is a schematic cross-sectional view illustrating the structure of the imaging device according to the first embodiment of the present invention.
Figure 4:
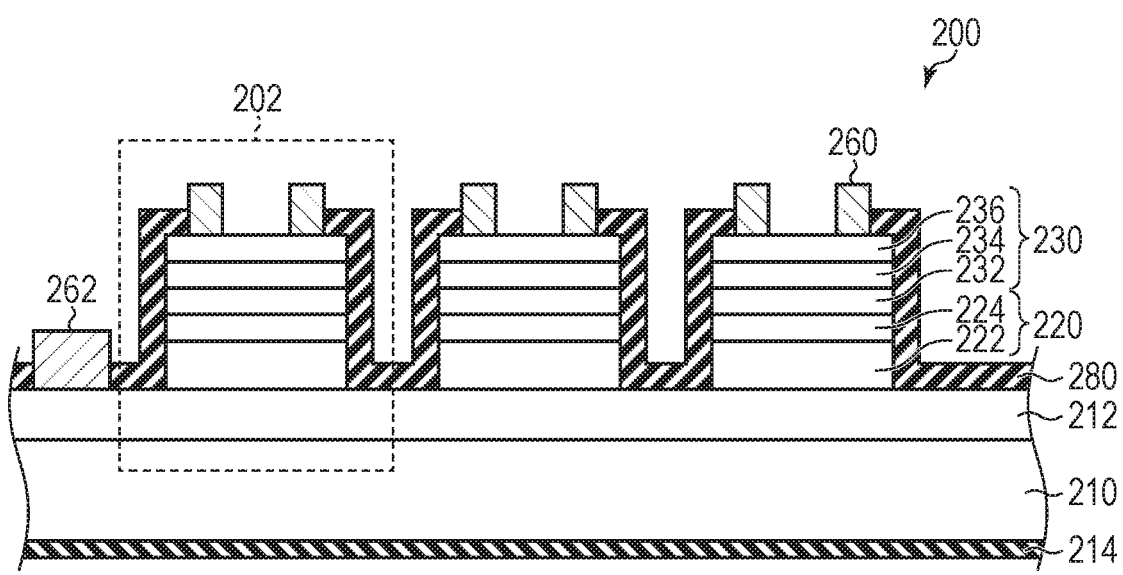
FIG. 4 is a schematic cross-sectional view illustrating the structure of the sensor substrate forming the imaging device according to the first embodiment of the present invention.
Figure 5:
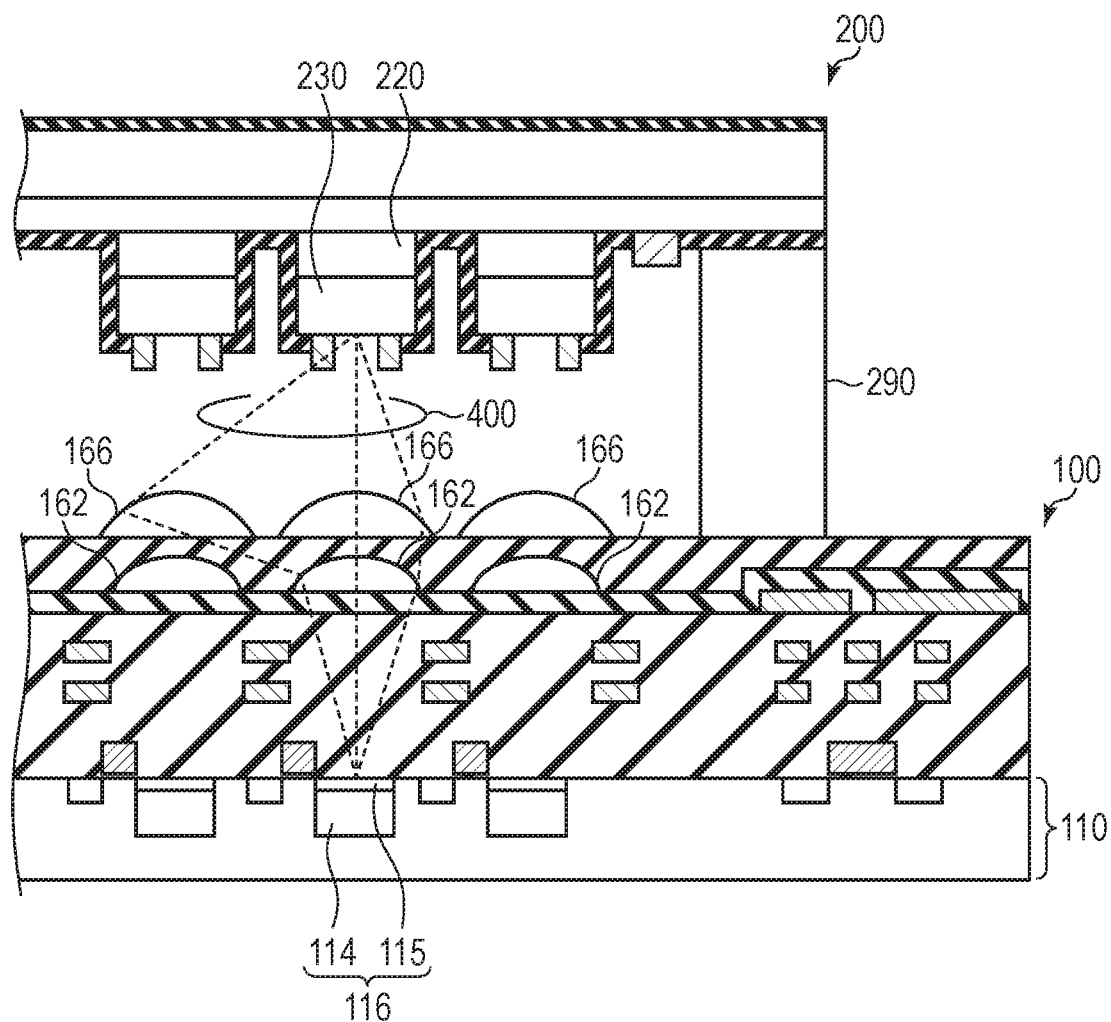
FIG. 5 is a diagram illustrating optical connection between the readout circuit substrate and the sensor substrate forming the imaging device according to the first embodiment of the present invention.
Figure 6:
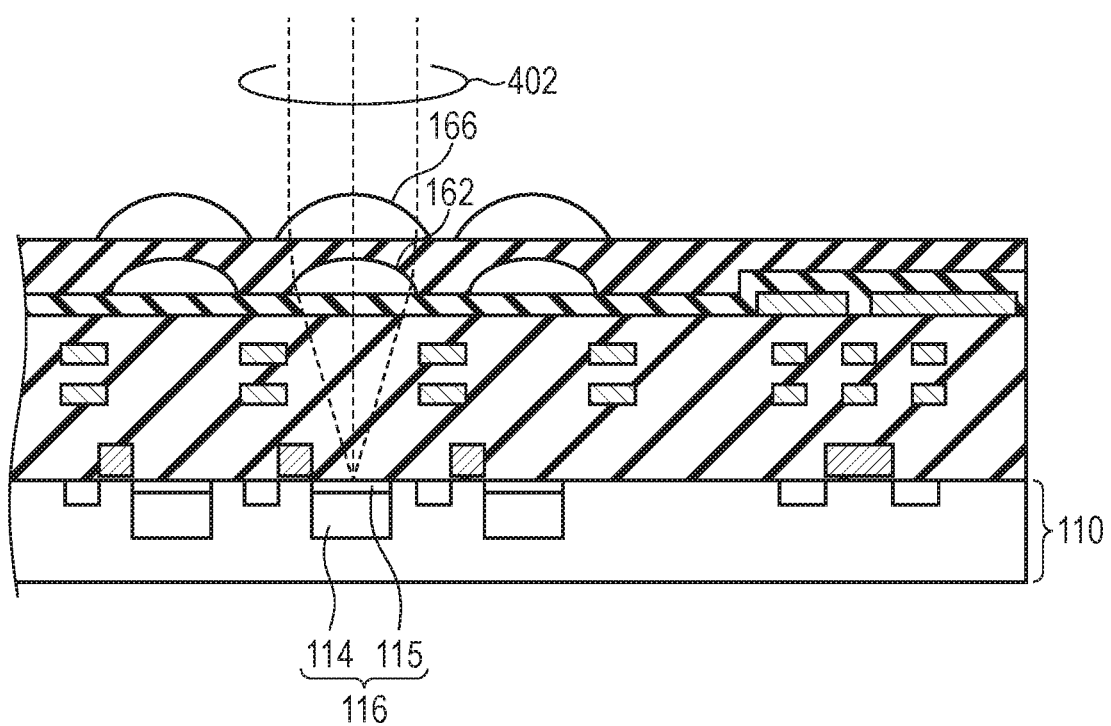
FIG. 6 is a diagram illustrating a track of a light passing through an optical system of a general CMOS image sensor.
Figure 7:
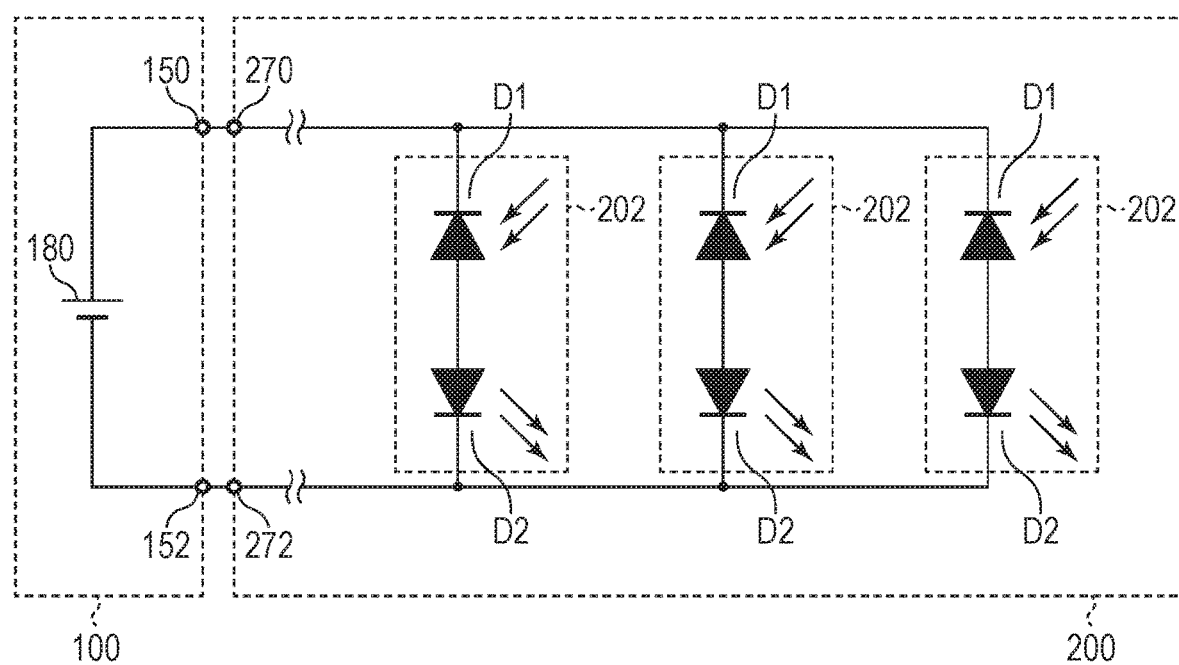
FIG. 7 is an equivalent circuit diagram illustrating the operation of the sensor substrate forming the imaging device according to the first embodiment of the present invention.

An imaging device according to a first embodiment of the present invention will be described with reference to FIG. 1 to FIG. 7. FIG. 1 is a perspective view illustrating the structure of an imaging device according to the present embodiment. FIG. 2A and FIG. 2B are diagrams each illustrating one example of a plan layout of a readout circuit substrate and a sensor substrate forming the imaging device according to the present embodiment. FIG. 3 is a schematic cross-sectional view illustrating the structure of the imaging device according to the present embodiment. FIG. 4 is a schematic cross-sectional view illustrating the structure of the sensor substrate forming the imaging device according to the present embodiment. FIG. 5 is a diagram illustrating optical connection between the readout circuit substrate and the sensor substrate forming the imaging device according to the present embodiment. FIG. 6 is a diagram illustrating a track of a light passing through an optical system of a general CMOS image sensor used in a visible light band camera or the like. FIG. 7 is an equivalent circuit diagram illustrating the operation of the sensor substrate forming the imaging device according to the present embodiment.

As illustrated in FIG. 1, an imaging device 300 according to the present embodiment has the structure in which a readout circuit substrate 100 and a sensor substrate 200 are attached to each other. The sensor substrate 200 is a substrate including an optical sensor used for image capturing. The readout circuit substrate 100 is a substrate including a readout integrated circuit (RoIC) used for outputting, as a readout image signal, information detected by an optical sensor of the sensor substrate 200. The readout circuit substrate 100 and the sensor substrate 200 are attached via spacers 290 so as to face each other via a predetermined spacing. Between the readout circuit substrate 100 and the sensor substrate 200, bumps 170 responsible for electrically connecting them are provided.

For a base material of the readout circuit substrate 100, a silicon substrate for which wafer process techniques or integration techniques have been accumulated is preferably used in terms of providing a readout integration circuit. Further, the primary reason why an optical sensor is mounted on the sensor substrate 200 separated from the readout circuit substrate 100 is to use a substrate whose material is different in light absorption characteristics from a material forming the readout circuit substrate 100. From such a point of view, a substrate made of a material different from silicon, for example, a compound semiconductor substrate is preferably used for a base material of the sensor substrate 200. A compound semiconductor substrate may be an InP substrate, a GaAs substrate, or the like. Note that the absorption wavelength band of a material based on InGaAs, GaAsSb, AlGaInAsP, or the like that enables crystal growth over InP or GaAs substrate is in the longer wavelength side than the absorption wavelength band of a single crystalline silicon. The sensor substrate 200 may be one in which a compound semiconductor layer such as an InP layer is provided in a separate substrate such as a sapphire substrate. While an example in which a silicon substrate is used as the base material of the readout circuit substrate 100 and an InP substrate is used as the base material of the sensor substrate 200 will be described in the present embodiment, materials of the readout circuit substrate 100 and the sensor substrate 200 may be appropriately selected where necessary.

FIG. 2A is a diagram illustrating one example of a plan layout of the readout circuit substrate 100. As illustrated in FIG. 2A, a pixel region 104 in which a plurality of pixels 102 are arranged in a matrix and a peripheral circuit region 106 in which a peripheral circuit used for performing driving of the pixels 102 or processing of output signals from the pixels 102 is arranged are provided in the readout circuit substrate 100. Further, pad electrodes 150 and 152 used for electrical connection to the sensor substrate 200 via the bumps 170, and a plurality of pad electrodes 154 used for external electrical connection are provided on the readout circuit substrate 100. The pad electrodes 150 and 152 are provided outside the pixel region 104. The pad electrodes 150 and 152 are connected to the peripheral circuit via internal interconnections (not illustrated) and configured to be able to supply power to the sensor substrate 200 via the pad electrodes 150 and 152 and the bumps 170.

FIG. 2B is a diagram illustrating one example of a plan layout of the sensor substrate 200. As illustrated in FIG. 2B, a pixel region 204 in which a plurality of pixels 202 are arranged in a matrix and spacers 290 arranged so as to surround the pixel region 204 are provided in the sensor substrate 200. Further, a pad electrode 270 electrically connected to a common electrode 262 arranged so as to surround the pixel region 204 and a pad electrode 272 electrically connected to ring electrodes 260 of respective pixels 202 are provided in the sensor substrate 200. The pad electrodes 270 and 272 are provided outside the pixel region 204. The plurality of pixels 202 are arranged so as to face the plurality of pixels 102 arranged in the pixel region 104 of the readout circuit substrate 100, respectively, when the readout circuit substrate 100 and the sensor substrate 200 are attached to each other. Further, the pad electrodes 270 and 272 are arranged so as to face the pad electrodes 150 and 152 arranged in the readout circuit substrate 100, respectively, when the readout circuit substrate 100 and the sensor substrate 200 are attached to each other.

FIG. 3 is a schematic cross-sectional view taken along a line A-A' of FIG. 2A and FIG. 2B after the readout circuit substrate 100 and the sensor substrate 200 are attached to each other.

The readout circuit substrate 100 includes a silicon substrate 110 as the base material. The pixel region 104 and the peripheral circuit region 106 described previously are provided in the silicon substrate 110. FIG. 3 illustrates three pixels 102 arranged in the pixel region 104 and one peripheral transistor MP arranged in the peripheral circuit region 106. In the actual implementation, the plurality of pixels 102 are arranged in a matrix in the pixel region 104. Further, a plurality of peripheral transistors MP including those having the opposite conductivity type in the peripheral circuit region 106 are arranged. Note that while a case where signal charges are electrons will be described below as an example, signal charges may be holes. When signal charges are holes, the conductivity type of each semiconductor region will be the opposite conductivity type.

Each of the pixels 102 includes a light receiving unit 116, a floating diffusion (hereafter, referred to as "FD"), a transfer transistor M1, a first lens 162, and a second lens 166. Note that the pixel 102 may include an in-pixel readout circuit including an amplifier transistor, a reset transistor, a select transistor, or the like as with a general CMOS image sensor.

Each light receiving unit 116 is a photodiode including an n-type semiconductor region 114 and a p-type semiconductor region 115 provided inside the silicon substrate 110. Signal charges generated by photoelectric conversion inside the silicon substrate 110 are collected in the n-type semiconductor region 114. The p-type semiconductor region 115 is arranged so as to be in contact with a primary face 112 of the silicon substrate 110. The photodiode forming the light receiving unit 116 is a so-called buried photodiode.

Each FD is formed of an n-type semiconductor region 118 provided inside the silicon substrate 110. Each transfer transistor M1 includes a gate electrode 128 provided via a gate insulating film 124 over the silicon substrate 110 between the n-type semiconductor region 114 and the n-type semiconductor region 118. The transfer transistor M1 has a function of transferring signal charges generated by the light receiving unit 116 and accumulated in the n-type semiconductor region 114 to the FD. The signal charges transferred to the FD are converted by a capacitance component of the FD into a voltage in accordance with an amount of signal charges transferred from the light receiving unit 116. The FD is electrically connected to the input node of an amplifier unit (not illustrated). The amplifier unit may be arranged in each pixel. Alternatively, the FD is electrically connected to a signal output line (not illustrated).

The peripheral transistor MP includes n-type semiconductor regions 120 and 122 as source/drain regions provided inside the silicon substrate 110 and a gate electrode 130 provided over a silicon substrate 110 between the n-type semiconductor regions 120 and 122 with a gate insulating film 126 interposed therebetween.

An insulating layer 140 is provided in the silicon substrate 110. The insulating layer 140 may be formed of silicon oxide, for example. A first interconnection layer 142 and a second interconnection layer 144 are provided inside the insulating layer 140. A third interconnection layer 146 is provided in the insulating layer 140. The first interconnection layer 142, the second interconnection layer 144, and the third interconnection layer 146 are arranged at different levels with respect to the primary face 112 of the silicon substrate 110. The first interconnection layer 142 and the second interconnection layer 144 are formed of conductive members whose primary material is copper, for example. The third interconnection layer 146 is formed of a conductive member whose primary material is aluminum, for example. The pad electrodes 150, 152, and 154 may be formed of the third interconnection layer 146.

The conductive member of a part of the first interconnection layer 142 and the conductive member of a part of the second interconnection layer 144 are electrically connected by a via plug (not illustrated). The conductive member of a part of the second interconnection layer 144 and the conductive member of a part of the third interconnection layer 146 are electrically connected by a via plug (not illustrated). The via plug may be formed of a conductive material such as tungsten, for example. The conductive member of the first interconnection layer 142, the conductive member of the second interconnection layer 144, and the conductive member of the third interconnection layer 146 are insulated from each other by the insulating layer 140 except for portions electrically connected by via plugs. In this example, the third interconnection layer 146 of these interconnection layers is the most distant interconnection layer from the silicon substrate 110.

Note that the insulating layer 140 is not necessarily required to be formed of a single type of insulating material but may be formed of a stacked member of multiple insulating layers including different materials. For example, the insulating layer 140 may include an anti-reflection film that prevents reflection at the surface of the silicon substrate 110, a diffusion prevention film that prevents diffusion of a conductive member, an etching stopper film, or the like.

Further, the number of interconnection layers is not limited to three. Further, the conductive members forming the first interconnection layer 142, the second interconnection layer 144, and the third interconnection layer 146 are also not limited to the example described above, and the first interconnection layer 142 and the second interconnection layer 144 may be formed of conductive members whose primary material is aluminum, for example.

An insulating layer 160 is provided over the insulating layer 140 in which the third interconnection layer 146 is provided. The insulating layer 160 may function as a protection film. First lenses 162 are arranged for the corresponding pixels 102 over the insulating layer 160. The insulating layer 160 and the first lenses 162 may be formed of silicon nitride, for example. In such a case, each refractive index of the member forming the insulating layer 160 and the member forming the first lenses 162 is higher than the refractive index of the member forming the insulating layer 140. Note that the refractive index of the member forming the insulating layer 160 may be different from the refractive index of the member forming the insulating layer 140. Further, the insulating layer 160 and the first lenses 162 may not necessarily be provided. Moreover, a planarization film 164 and second lenses 166 may be further provided over the first lenses 162.

The sensor substrate 200 includes an InP substrate 210 as the base material. The pixel region 204 described previously is provided in the InP substrate 210. A common layer 212 made of p-type InP, for example, is provided over the InP substrate 210. The plurality of pixels 202 each made of a mesa structure including a light receiving unit 220, a light emitting unit 230, and the ring electrode 260 are provided over the common layer 212. The common layer 212 may be a part of the semiconductor layer forming the light receiving units 220. A protection film 280 is provided over a sidewall part of the mesa structure. An anti-reflection film 214 is provided over the backside of the InP substrate 210.

The ring electrodes 260 of the plurality of pixels 202 forming the pixel region 204 and the pad electrode 272 are electrically connected to each other, as illustrated in FIG. 2B. Further, the light receiving units 220 of the plurality of pixels 202 forming the pixel region 204 are connected to the common layer 212 and then electrically connected to the pad electrode 270 via the common electrode 262 used for providing electrical contact to the common layer 212. That is, except for a voltage drop at the common electrode 262, the mesa structure of the plurality of pixels 202 is designed such that substantially the same voltage is applied thereto through the ring electrodes 260 and the common electrode 262.

The layer arrangement illustrated in FIG. 4 may be applied to the more specific structure of the sensor substrate 200, for example. Note that the top and bottom of FIG. 4 are opposite to those of FIG. 3 for the purpose of illustrating respective layers in the order of crystal growth over the InP substrate 210.

The common layer 212 connected to the light receiving units 220 of respective pixels 202 is provided over the primary face of the InP substrate 210 having a thickness of around 500 μm. The common layer 212 is formed of a p-type InP layer having a thickness of 3 μm, for example. An undoped InGaAs layer 222 having a thickness of 4 μm and an n-type InP layer 224 having a thickness of 1 μm are stacked in this order over the common layer 212. The common layer 212, the undoped InGaAs layer 222, and the n-type InP layer 224 form the light receiving units 220 described above, and the undoped InGaAs layer 222 functions as a light receiving layer. The light receiving layer made of InGaAs has an absorption wavelength band in an infrared wavelength band. An n-type InP layer 232 having a thickness of 4 μm, an undoped InP layer 234, and a p-type InP layer 236 are stacked in this order over the n-type InP layer 224. The n-type InP layer 232, the undoped InP layer 234, and the p-type InP layer 236 form the light emitting units 230 described above, and the undoped InP layer 234 functions as a light emitting layer. The emission center wavelength of the light emitting unit 230 in which a light emitting layer is formed of InP is around 920 nm. The ring electrodes 260 are provided over the p-type InP layer 236 via an InGaAs contact layer (not illustrated). The ring electrodes 260 provided over the light emitting units 230 of respective pixels 202 are electrically connected to each other as described previously and are at substantially the same electrical potential except for a voltage drop due to an electrical resistance of interconnections connecting them.

As illustrated in FIG. 3, the readout circuit substrate 100 and the sensor substrate 200 are arranged such that the primary faces thereof face each other and in parallel. The plurality of pixels 102 of the readout circuit substrate 100 and the plurality of pixels 202 of the sensor substrate 200 are arranged at the same pitch so as to form respective pairs. The light receiving unit 116 of the pixel 102 and the light emitting unit 230 of the pixel 202 which form a pair are optically connected via the first lens 162 and the second lens 166.

As discussed above, the imaging device according to the present embodiment includes the light emitting units 230 in the sensor substrate 200 on which a sensor element for image capturing (the light receiving units 220) is provided and the light receiving units 116 in the readout circuit substrate 100 on which an RoIC is provided. Further, a light emitted from the light emitting unit 230 provided in the sensor substrate 200 is detected by the light receiving unit 116 provided in the readout circuit substrate 100. Thus, by causing the light emitting unit 230 to emit light in accordance with the amount of light received by the light receiving unit 220 and detecting it by the light receiving unit 116, it is possible to transmit information detected by the light receiving unit 220 to the readout circuit substrate 100. That is, the imaging device according to the present embodiment is not configured such that the pixels 102 provided in the readout circuit substrate 100 and the pixels 202 provided in the sensor substrate 200 are electrically connected via metal bumps.

FIG. 5 is a diagram illustrating optical connection between the readout circuit substrate 100 and the sensor substrate 200. In the imaging device of the present embodiment, one lens group is formed of the first lens 162 and the second lens 166, and a light 400 emitted from the light emitting unit 230 of the sensor substrate 200 is captured as an image on the light receiving unit 116 of the readout circuit substrate 100 through such a lens group.

In the imaging device of the present embodiment, an optical system is designed based on a relationship of Equation (1) below in accordance with a so-called lens formula.

$$1/f = 1/d_1 + 1/d_2 \quad (1)$$

Here, the variable $d_1$ denotes an optical distance from the interface between the second lens 166 and the air to the light receiving unit 116. The variable $d_2$ denotes an optical distance from the interface between the second lens 166 and the air to the light emitting unit 230. The variable f denotes an effective focal length of the lens group. Note that an optical distance is represented as a product of a refractive index of a substance where a light propagates and a physical distance where a light propagates through the substance.

For comparison, FIG. 6 illustrates one example of a track of a light 402 passing through an optical system of a general CMOS image sensor used in a camera or the like having a sensitivity in a visible light band. As illustrated in FIG. 6, an optical system of a general CMOS image sensor is configured to converge a light that is closer to a parallel light than in the case of an optical system of the present embodiment into the light receiving unit 116. That is, in a general CMOS image sensor, unlike the imaging device according to the present embodiment, an optical system is designed based on a relationship of Equation (2) below.

$$f = d_1 \qquad (2)$$

Next, in the imaging device according to the present embodiment, the principle by which the light receiving unit 220 of the sensor substrate 200 transmits a detected image to the readout circuit substrate 100 will be described.

FIG. 7 is an equivalent circuit diagram illustrating the operation of the sensor substrate 200. In FIG. 7, a photodiode D1 corresponds to the light receiving unit 220 of FIG. 3, and a light emitting diode D2 corresponds to the light emitting unit 230 of FIG. 3. Note that, in FIG. 7, an interconnection connected between the ring electrodes 260 of respective pixels 202 and electric resisters of the common electrode 262 and the common layer 212 are omitted.

As illustrated in FIG. 7, the photodiode D1 and the light emitting diode D2 forming each pixel 202 are connected in series such that the direction of the p-n junction is opposite to each other. Further, a DC power source 180 that supplies power from the readout circuit substrate 100 to the sensor substrate 200 via the pad electrodes 150, 152, 270, and 272 is connected to apply a reverse bias to the photodiode D1 and apply a forward bias to the light emitting diode D2. The voltage of the DC power source 180 is 5.0 V, for example.

With the DC power source 180 being connected to the series-connected circuit of the photodiode D1 and the light emitting diode D2 as described above, most part of the voltage supplied from the DC power source 180 is applied to the photodiode D1. Thereby, the photodiode D1 is in a state where a sufficient reverse bias is applied, and the current flowing in the photodiode D1 changes depending on the amount of a light entering the photodiode D1. Since the photodiode D1 and the light emitting diode D2 are connected in series, the current flowing in the light emitting diode D2 is the same as the current flowing in the photodiode D1. Further, a light amount emitted from the light emitting diode D2 is proportional to a current value flowing in the light emitting diode D2 rather than a voltage applied to the light emitting diode D2 as with a general LED. As a result, the light emitting diode D2 emits light with a light amount proportional to the amount of light entering the photodiode D1.

In the imaging device according to the present embodiment, however, some degrees of a light from the light emitting unit 230 to the light receiving unit 220 is fed back due to the structure thereof. When the amount of such feedback exceeds one and becomes positive feedback, and once the light emitting unit 230 exceeds the threshold, the light emitting unit 230 will emit light regardless of an incident light amount to the light receiving unit 220, and information of the light receiving unit 220 is unable to be transmitted to the readout circuit substrate 100. Thus, the amount of a current generated by the light receiving unit 220 due to a light emitted from the light emitting unit 230 due to a current is required to be smaller than the feedback amount from the light emitting unit 230 to the light receiving unit 220, more specifically, the amount of the current flowing into the light emitting unit 230. Thus, for example, a configuration that enters two stable states by positive feedback and has an effect of a memory as disclosed in Japanese Patent Application Laid-Open No. S55-026615 is unsuitable for the configuration of the sensor substrate 200 of the imaging device according to the present embodiment.

In the structure illustrated in FIG. 4, the stack from the common layer 212 to the p-type InP layer 236 includes the i-layer (intrinsic layer) inserted in the middle thereof but includes the p-n-p structure as a whole. Thus, when the total film thickness of the n-type InP layers 224 and 232 is less than or equal to the thickness in which holes, which are minority carriers, can be diffused, an operation like a bipolar transistor is exhibited. When the operation like a bipolar transistor becomes significant and the amplification effect exceeds a certain level, positive feedback occurs from the light emitting unit 230 to the light receiving unit 220, and the light emission amount at the light emitting unit 230 is no longer an amount in accordance with a light amount received at the light receiving unit 220.

Accordingly, in the present embodiment, the total film thickness of the n-type InP layers 224 and 232 corresponding to a base layer is larger than the thickness corresponding to the diffusion length of minority carriers in order to cause the pixel 202 to operate stably without causing positive feedback. For example, the diffusion length of holes in the n-type InP layers 224 and 232 of the present embodiment is around 4 μm. Accordingly, in the present embodiment, the total film thickness of the n-type InP layers 224 and 232 is set to 5 μm that is thicker than the diffusion length of holes.

Note that, while the case where the diffusion length of holes is assumed to be around 4 μm here, the diffusion length of holes changes in accordance with a material or the like, and an amplification factor of a bipolar transistor changes in accordance with a doping concentration of respective layers forming a p-n junction. It is therefore desirable to adjust the total film thickness of an n-type layer appropriately in accordance with the materials forming the light receiving unit 220 and the light emitting unit 230 or the doping concentration of respective layers.

Further, diffusion of minority carriers may be blocked by inserting a layer such as AlInP, which has a larger energy band gap than that of periphery in a stack forming the light receiving unit 220 and the light emitting unit 230, and providing a barrier on a valence band side. Further, accumulation and recoupling of carriers may be facilitated by inserting a layer having a smaller energy band gap than that of InP in order to confine minority carriers.

In the present embodiment, the InP substrate 210 has a thickness of around 500 μm and not significantly thinned from the initial thickness of the InP substrate 210 used in crystal growth of each layer. This has a purpose of absorbing a visible light in addition to facilitating handling of the sensor substrate 200 during manufacturing.

For example, since the absorption coefficient of InP for a light of a wavelength of 950 nm is $3 \times 10^2$ cm$^{-1}$, the InP substrate 210 having a thickness of around 230 μm is required for absorbing 99% of the light of a wavelength of 950 nm. Since the absorption coefficient of a light on a shorter wavelength side of the wavelength of 950 nm is much larger, with a thickness of around 230 μm or greater, a visible light can be reliably absorbed.

Next, the summary of a method of manufacturing an imaging device according to the present embodiment (step of attaching the readout circuit substrate 100 and the sensor substrate 200 to each other) will be described.

First, the readout circuit substrate 100 and the sensor substrate 200 are fabricated by a semiconductor wafer process, respectively. Then, metal bumps made of a metal material such as gold or copper are formed on the pad electrodes 150 and 152 of the readout circuit substrate 100 and the pad electrodes 270 and 272 of the sensor substrate 200, respectively.

Next, the sensor substrate 200 is positioned and installed on the readout circuit substrate 100, and the sensor substrate 200 is pressed against the readout circuit substrate 100 under an increased temperature. Thereby, metal bumps installed on the pad electrodes 150 and 152 and metal bumps installed on the pad electrodes 270 and 272 are subjected to thermocompression bonding, respectively, and electrical connection between the readout circuit substrate 100 and the sensor substrate 200 is established. At this time, the spacing between the readout circuit substrate 100 and the sensor substrate 200 is defined by the height of the spacers 290.

In the present embodiment, electrical connection portions between the readout circuit substrate 100 and the sensor substrate 200 are only the bumps 170 connected between the pad electrode 150 and the pad electrode 270 and between the pad electrode 152 and the pad electrode 272. It is therefore possible to reduce influence on a manufacturing yield caused by a joining process of the readout circuit substrate 100 and the sensor substrate 200 and improve a connection reliability between the readout circuit substrate 100 and the sensor substrate 200.

Next, an adhesive agent is applied to the outer circumference of the sensor substrate 200 by using the dispenser or the like after cooled to a room temperature, and the sensor substrate 200 is fixed to the readout circuit substrate 100.

Note that the number or the arrangement of pad electrodes used for electrically connecting the readout circuit substrate 100 and the sensor substrate 200 to each other, the outer circumference shapes of the pixel regions 104 and 204, the arrangement of the peripheral circuit region 106, or the like may be appropriately changed if necessary. Further, a scheme of electrical connection between the readout circuit substrate 100 and the sensor substrate 200 is not limited to a form of metal bumps as long as it can supply power, and a conductive paste or the like may be used, for example. Further, a scheme of fixing the sensor substrate 200 to the readout circuit substrate 100 is not limited to an adhesive agent, and other fixing schemes may be used.

As described above, according to the present embodiment, image information captured by the sensor substrate 200 may be transferred to the readout circuit substrate 100 and electrically read out without a use of electrical connection on a pixel basis. This facilitates reduction in the pixel size or increase in the area of the sensor unit, and it is possible to realize a high-performance and reliable imaging device that can acquire an image of a long wavelength band such as above 1.0 µm.

Second Embodiment

Figure 8:
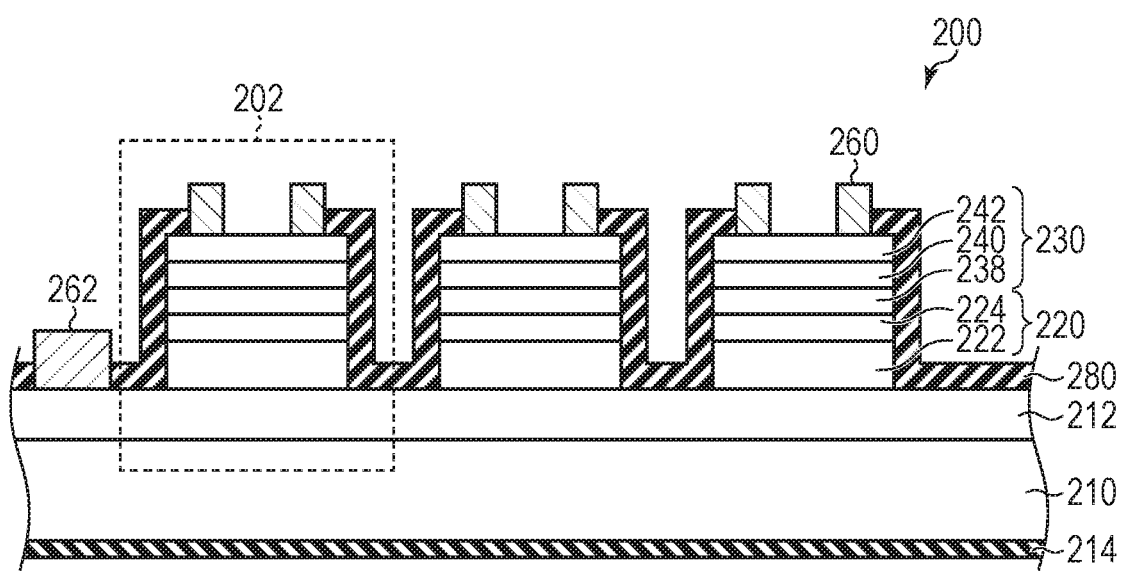
FIG. 8 is a schematic cross-sectional view illustrating the structure of a sensor substrate forming an imaging device according to a second embodiment of the present invention.

An imaging device according to a second embodiment of the present invention will be described with reference to FIG. 8. Components similar to those of the imaging device according to the first embodiment are labeled with the same references, and the description thereof will be omitted or simplified. FIG. 8 is a schematic cross-sectional view illustrating the structure of a sensor substrate forming the imaging device according to the present embodiment.

The imaging device according to the present embodiment is the same as the imaging device according to the first embodiment except for a difference in the configuration of the light emitting unit 230 provided in the sensor substrate 200. That is, as illustrated in FIG. 8, the pixel 202 of the imaging device according to the present embodiment includes the light emitting unit 230 in which an n-type AlInAs layer 238, an undoped AlGaInAs layer 240, and a p-type AlInAs layer 242 are stacked in this order on the light receiving unit 220. The undoped AlGaInAs layer 240 functions as a light emitting layer.

AlGaInAs forming the undoped AlGaInAs layer 240 is a mixed crystal of AlAs, GaAs, and InAs and may control the energy band gap, that is, the emission center wavelength in accordance with the composition ratio thereof. Thereby, it is possible to realize a composition having a larger energy band gap than InP used in the light emitting layer of the light emitting unit 230 in the imaging device of the first embodiment and set the emission center wavelength to around 820 nm, for example. In such a case, since the sensitivity of a photodiode (the light receiving unit 116) made of silicon is higher for a light of a wavelength of 820 nm than for a light of a wavelength of 920 nm, which is the emission center wavelength of InP, light emission of the light emitting unit 230 may be detected at a higher sensitivity.

Note that, while the light emitting layer of the light emitting unit 230 is formed of AlGaInAs in the present embodiment, the material is not particularly limited as long as it has a desired emission center wavelength and enables epitaxial growth on the base material (the InP substrate 210). For example, instead of AlGaInAs, AlInAs without Ga may be used. Further, the light emitting layer may be formed of a plurality of layers or may be formed of quantum well structure. In addition, the structure used in a general LED may be introduced as the light emitting unit 230.

As described above, according to the present embodiment, it is possible to realize increase in sensitivity of an imaging device in addition to obtain the same advantage as that of the first embodiment.

Third Embodiment

Figure 9:
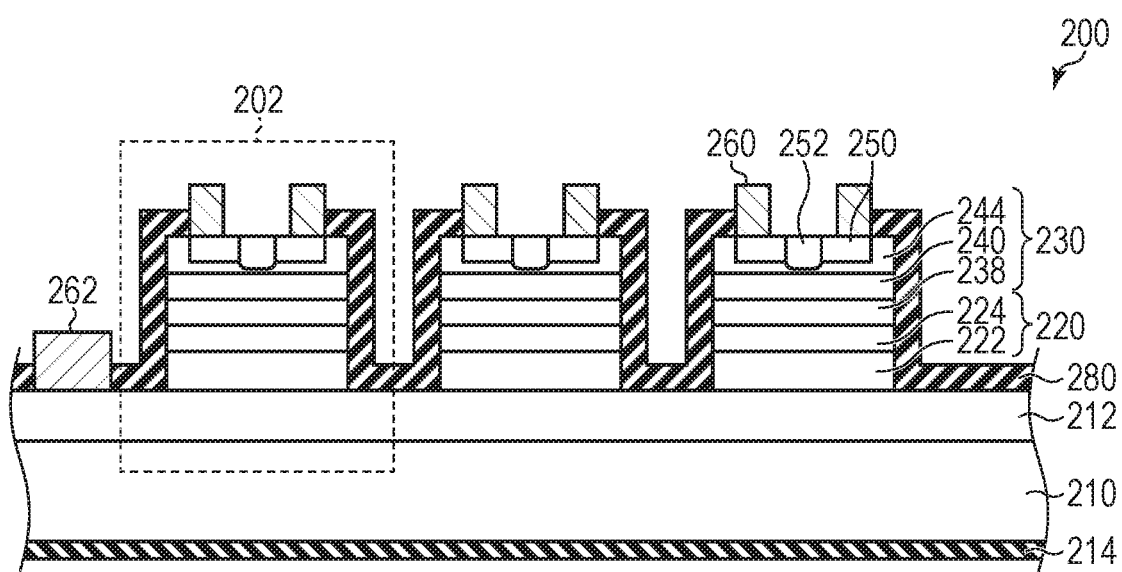
FIG. 9 is a schematic cross-sectional view illustrating the structure of a sensor substrate forming an imaging device according to a third embodiment of the present invention.

An imaging device according to a third embodiment of the present invention will be described with reference to FIG. 9. Components similar to those of the imaging device according to the first and second embodiments are labeled with the same references, and the description thereof will be omitted or simplified. FIG. 9 is a schematic cross-sectional view illustrating the structure of a sensor substrate forming the imaging device according to the present embodiment.

The imaging device according to the present embodiment is the same as the imaging device according to the first and second embodiments except for a difference in the configuration of the light emitting unit 230 provided in the sensor substrate 200. That is, as illustrated in FIG. 9, the pixel 202 of the imaging device according to the present embodiment includes the light emitting unit 230 in which the n-type AlInAs layer 238, the undoped AlGaInAs layer 240, and an undoped AlInAs layer 244 are stacked in this order on the light receiving unit 220. P-type regions 250 and 252 are provided in the undoped AlInAs layer 244. The p-type region 250 is provided on the surface part of the undoped AlInAs layer 244 so as to be in contact with the ring electrode 260. The p-type region 252 is provided at a deeper part than the depth of the p-type region 250 from the surface part of the undoped AlInAs layer 244 inside the undoped AlInAs layer 244 surrounded by the ring electrode 260. In such a way, an in-plane distribution is provided in the p-type impurity added to the undoped AlInAs layer 244.

With such a configuration, the current flowing in the light emitting unit 230 concentrates in a path which runs through the p-type region 252 having the narrowest width in the depth direction of the undoped AlInAs layer 244 and causes locally intense light emission therein. As a result, it is possible to increase the ratio at which a light is emitted in a light extraction window region surrounded by the ring electrode 260 and improve a light extraction efficiency.

The p-type regions 250 and 252 are not particularly limited but may be formed by adding Zn to the undoped AlGaInAs layer 240 by using ion implantation method, for example. At this time, it is possible to form the p-type regions 250 and 252 having different depths by changing acceleration energy of implanted ions.

Note that while an application example to the imaging device according to the second embodiment has been illustrated in the present embodiment, the same configuration may be applied to the imaging device according to the first embodiment. In such a case, the p-type InP layer 236 may be used as an undoped InP layer, and the same p-type regions as the p-type regions 250 and 252 may be provided in this undoped InP layer.

As described above, according to the present embodiment, it is possible to realize further increase in sensitivity of an imaging device in addition to obtain the same advantages as that of the first and second embodiments.

Fourth Embodiment

Figure 10:
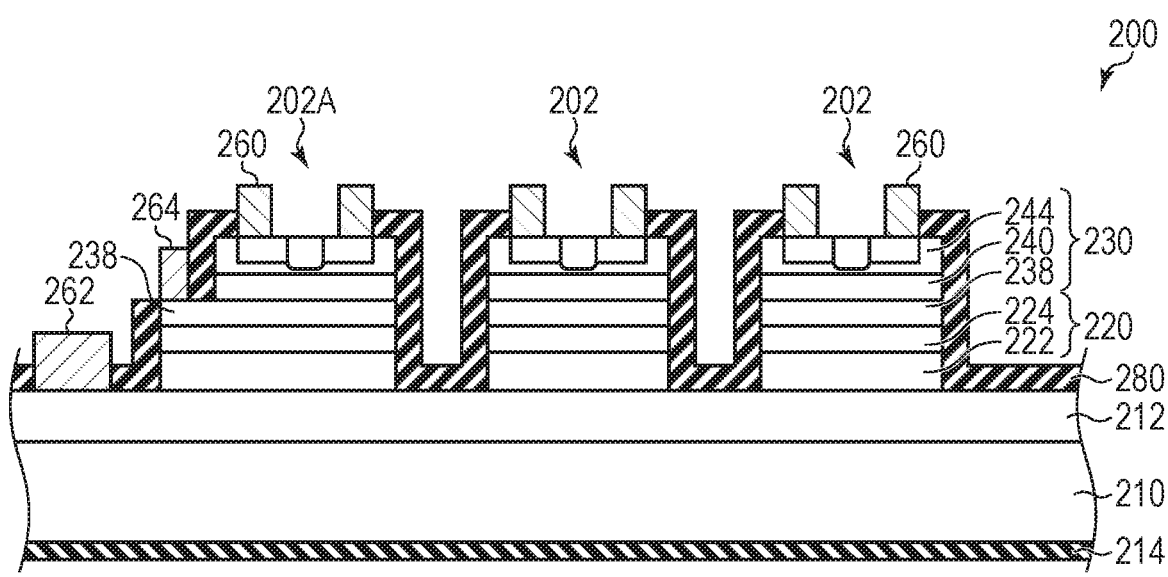
FIG. 10 is a schematic cross-sectional view illustrating the structure of a sensor substrate forming an imaging device according to a fourth embodiment of the present invention.

An imaging device according to a fourth embodiment of the present invention will be described with reference to FIG. 10. Components similar to those of the imaging device according to the first to third embodiments are labeled with the same references, and the description thereof will be omitted or simplified. FIG. 10 is a schematic cross-sectional view illustrating the structure of a sensor substrate forming the imaging device according to the present embodiment.

The imaging device according to the present embodiment is different from the imaging device according to the first to third embodiments in that some of the plurality of pixels 202 provided in the sensor substrate 200 each further include an individual electrode connected to the n-side terminal of the light emitting unit 230.

FIG. 10 illustrates an example in which the configuration described above of the present embodiment is applied to the sensor substrate 200 of the imaging device according to the third embodiment. That is, pixels 202A which are some of the plurality of pixels 202 provided in the sensor substrate 200 each include an individual electrode 264 provided on the n-type AlInAs layer 238 that is the n-side terminal of the light emitting unit 230. The individual electrode 264 is electrically connected to the peripheral circuit provided in the readout circuit substrate 100 via a wiring or a bump (not illustrated) as with the ring electrode 260 or the common electrode 262. Thereby, the light emitting unit 230 of the pixel 202A may cause light emission independently regardless of light incidence to the light receiving unit 220 by applying a voltage between the individual electrode 264 as an n-side electrode and the ring electrode 260 as a p-side electrode.

The light emitting unit 230 provided in the pixel 202A may be used for check of alignment between the readout circuit substrate 100 and the sensor substrate 200 in addition to transfer of information to the pixel 102. For example, after the readout circuit substrate 100 and the sensor substrate 200 are joined, a voltage is applied between the individual electrode 264 and the ring electrode 260 to cause light emission of the light emitting unit 230 of the pixel 202A, and the light amount received by the light receiving unit 116 of the pixel 102 paired with the pixel 202A is checked. By doing so, it is possible to check whether or not joining displacement in a direction parallel to the primary face of a substrate is within an acceptable range. This may prevent a defect whose displacement between the readout circuit substrate 100 and the sensor substrate 200 is out of the acceptable range from being delivered to a step of mounting the defect onto a ceramic package.

The location or the number of pixels 202A arranged inside the pixel region 204 is not particularly limited. In terms of detecting two-dimensionally displacement between the readout circuit substrate 100 and the sensor substrate 200, at least two pixels 202A arranged at distant locations are needed. For example, when the pixel region 204 has a rectangular shape as illustrated in FIG. 2B, two to four pixels 202 located near the four corners of the pixel region 204 may be used as the pixels 202A.

Displacement between the readout circuit substrate 100 and the sensor substrate 200 may be checked when the readout circuit substrate 100 and the sensor substrate 200 are joined. In such a case, the light emitting unit 230 of the pixel 202A is caused to emit light when the readout circuit substrate 100 and the sensor substrate 200 are joined, positioning to the optimum location is performed while the amount of light received by the light receiving unit 116 of the pixel 102 paired with the pixels 202A is monitored.

The advantage in such a case may be that accuracy of positioning may be higher than accuracy of mechanical positioning with a mounting apparatus. In particular, a significant advantage is obtained when a light is reduced by a lens in a configuration where the lens is used for optical connection between the light emitting unit 230 of the sensor substrate 200 and the light receiving unit 116 of the readout circuit substrate 100 or when the pixel pitch is small such as 10 micro meter or less, or the like. Note that the reason why the advantage is significant in a state where a lens is mounted is that a light is reduced to a small region by a lens and thus a change amount in a light amount resulted when displacement between the region and a light receiving unit 116 occurs is larger than that in a case with no lens.

In positioning by using a mounting apparatus, first, a pattern on the readout circuit substrate 100 and a pattern on the sensor substrate 200 are recognized by image recognition, and a displacement in a direction parallel to the primary face is identified. Then, the readout circuit substrate 100 and the sensor substrate 200 are moved close to each other and heated to be joined with bumps. When attachment is performed by relying only on mechanical accuracy after the displacement is identified, however, not a little displacement occurs, such as displacement from an ideal position occurs. While the problem due to the displacement is not important when the pixel pitch is relatively large, the influence due to the alignment displacement described above is no longer ignorable when the pixel pitch comes close to a usual image sensor of a visible light band formed of silicon.

Accordingly, the readout circuit substrate 100 and the sensor substrate 200 are moved close to each other by a several micro meters before coming into contact with each other, the light emitting unit 230 of the pixel 202A is caused to emit light in such a state, and a position at which the light receiving amount is the maximum is searched for while the light receiving amount is monitored by the light receiving unit 116. By doing so, since the readout circuit substrate 100 and the sensor substrate 200 may be aligned in a state of being close to each other as much as possible without a use of image recognition, displacement due to motion after alignment or the like may be significantly reduced.

Note that while an application example to the imaging device according to the third embodiment has been illustrated in the present embodiment, the same configuration may be applied to the imaging device according to the first or second embodiment.

As described above, according to the present embodiment, it is possible to improve positioning accuracy between the readout circuit substrate 100 and the sensor substrate 200 in addition to obtain the same advantages as that of the first to third embodiments. Thereby, improvement of the manufacturing yield and a further increase in the sensitivity may be realized.

Fifth Embodiment

Figure 11:
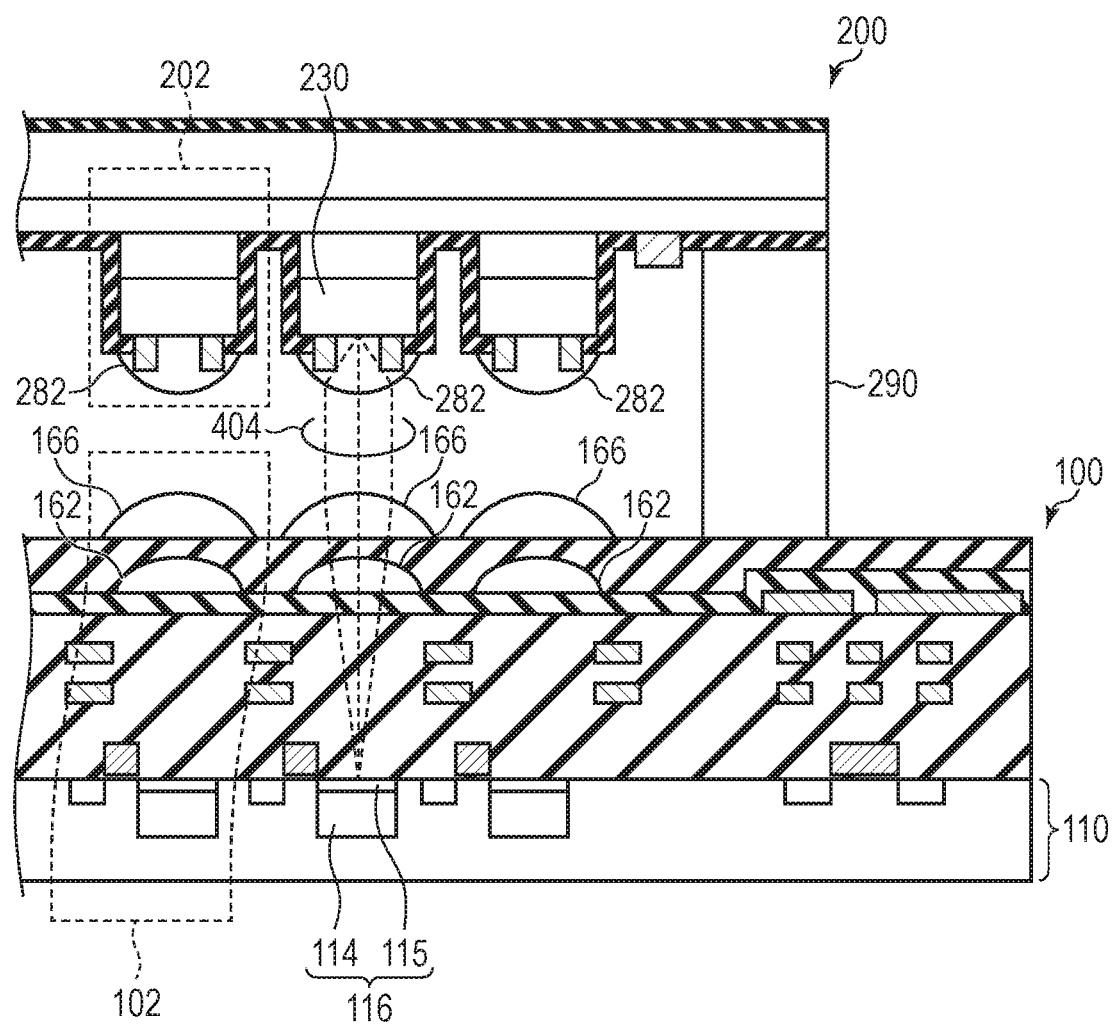
FIG. 11 is a schematic cross-sectional view illustrating the structure of an imaging device according to a fifth embodiment of the present invention.

An imaging device according to a fifth embodiment of the present invention will be described with reference to FIG. 11. Components similar to those of the imaging device according to the first to fourth embodiments are labeled with the same references, and the description thereof will be omitted or simplified. FIG. 11 is a schematic cross-sectional view illustrating the structure of the imaging device according to the present embodiment.

As illustrated in FIG. 11, the imaging device according to the present embodiment is different from the imaging devices according to the first to fourth embodiments in that lenses 282 provided on the light emitting units 230 of the sensor substrate 200 are further provided. The lens 282 has a function of shaping a light emitted from the light emitting unit 230 into substantially a parallel light. Further, in the imaging device according to the present embodiment, the first lens 162 and the second lens 166 provided on the readout circuit substrate 100 are configured to converge a parallel light 404 emitted from the lens 282 on the light receiving unit 116.

In the imaging device according to the present embodiment, since the sensor substrate 200 side is also provided with the lens 282, the number of manufacturing steps increases. In the imaging device according to the present embodiment, however, there is a specific advantage of being capable of suppressing variation in a light coupling efficiency due to variation of the spacing between the readout circuit substrate 100 and the sensor substrate 200.

An in-plane distribution or variation may occur in the spacing between the readout circuit substrate 100 and the sensor substrate 200 due to warping, variation in the attachment step, or the like of the readout circuit substrate 100 and the sensor substrate 200. A change in the distance between the readout circuit substrate 100 and the sensor substrate 200 causes a change in the distance between the lens group formed of the first lens 162 and the second lens 166 and the light emitting unit 230. As a result, in the imaging device according to the first embodiment, displacement occurs between a position at which a light beam is converged by the lens group and a position of the surface of the light receiving unit 116, which would affect a light coupling efficiency or the like between the readout circuit substrate 100 and the sensor substrate 200.

In this regard, in the imaging device according to the present embodiment, since a light emitted from the light emitting unit 230 is shaped in the parallel light 404 by the lens 282, even when the distance between the substrates changes, there is substantially no change in the position at which a light is converged inside the readout circuit substrate 100. As a result, according to the imaging device of the present embodiment, it is possible to suppress a change in a light coupling efficiency due to an in-plane distribution or variation of the spacing between the readout circuit substrate 100 and the sensor substrate 200.

As described above, according to the present embodiment, it is possible to suppress a change in a light coupling efficiency due to an in-plane distribution or variation of the spacing between the readout circuit substrate 100 and the sensor substrate 200 in addition to obtain the advantages of the first to fourth embodiments.

Sixth Embodiment

Figure 12:
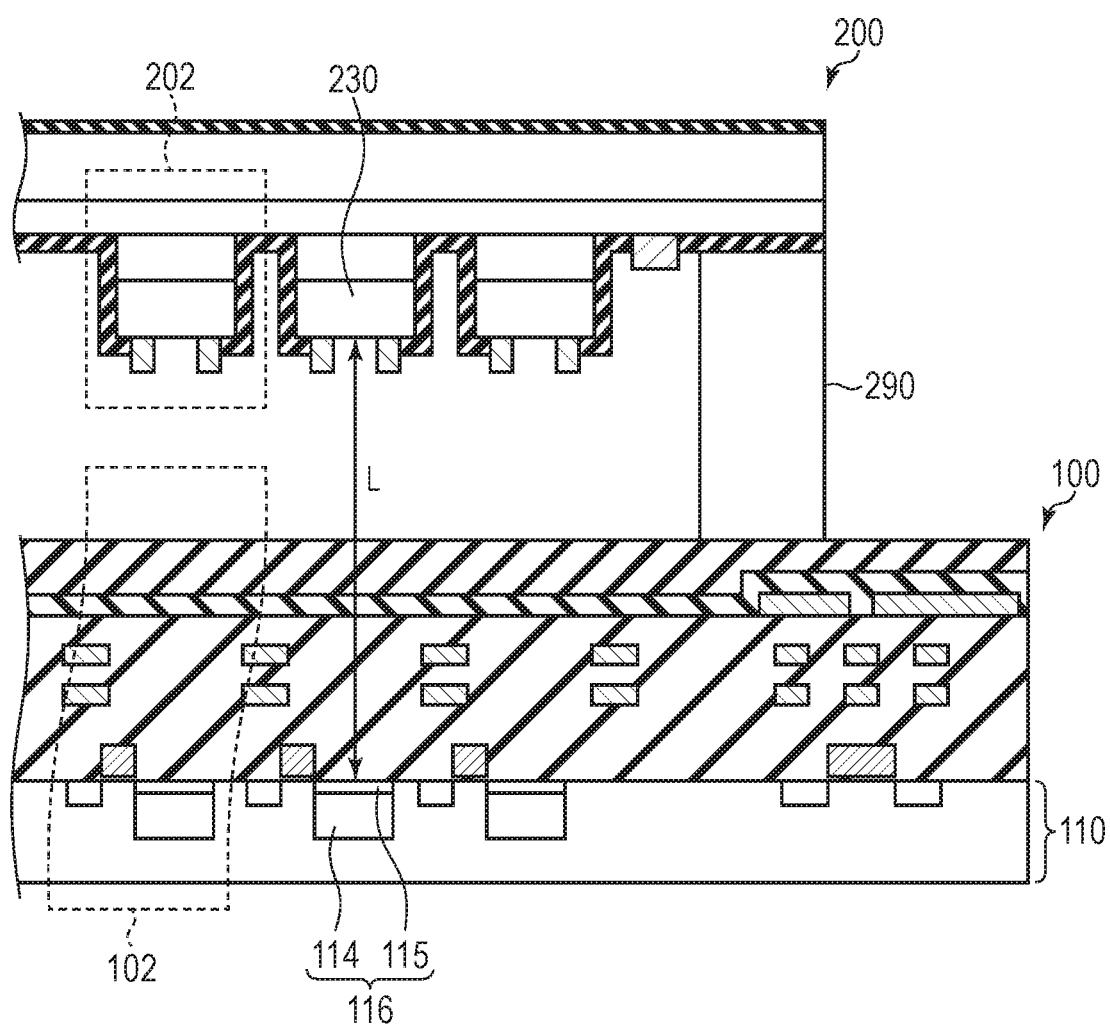
FIG. 12 is a schematic cross-sectional view illustrating the structure of an imaging device according to a sixth embodiment of the present invention.
Figure 13:
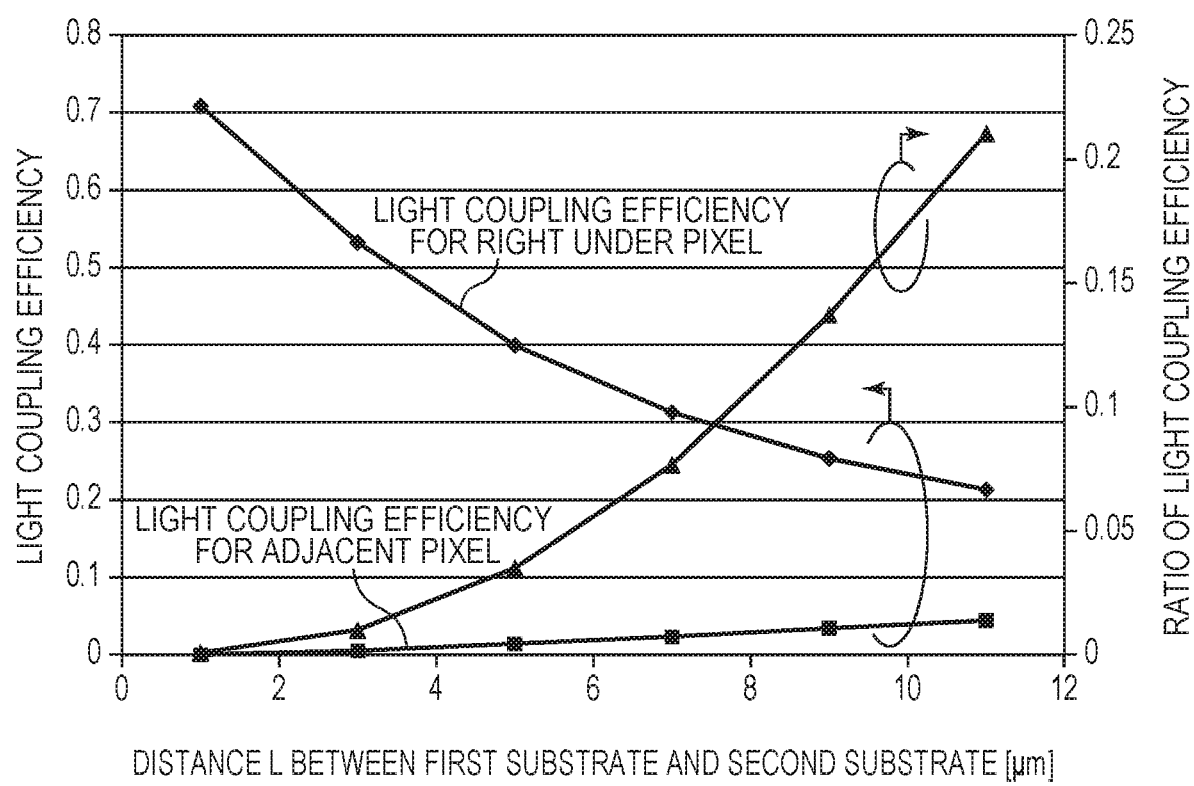
FIG. 13 is a graph illustrating a relationship between the distance between a readout circuit substrate and a sensor substrate and an optical coupling efficiency.

An imaging device according to a sixth embodiment of the present invention will be described with reference to FIG. 12 and FIG. 13. Components similar to those of the imaging device according to the first to fifth embodiments are labeled with the same references, and the description thereof will be omitted or simplified. FIG. 12 is a schematic cross-sectional view illustrating the structure of an imaging device according to the present embodiment. FIG. 13 is a graph illustrating a relationship between the distance between a readout circuit substrate and a sensor substrate and an optical coupling efficiency.

The imaging device according to the present embodiment is the same as the imaging device according to the first to fourth embodiments except that no lens group (the first lens 162 and the second lens 166) is provided on the readout circuit substrate 100. As illustrated in the present embodiment, a use of a lens group is not necessarily required for optical connection between the light emitting unit 230 of the pixel 202 provided in the sensor substrate 200 and the light receiving unit 116 of the pixel 102 provided in the readout circuit substrate 100. There is a merit in the imaging device according to the present embodiment that manufacturing cost may be reduced by omitting the step of forming the first lenses 162 and the second lenses 166.

FIG. 13 is a graph illustrating a result obtained by calculating inter-substrate distance dependency of the light coupling efficiency between the readout circuit substrate 100 and the sensor substrate 200 in the configuration of the imaging device according to the present embodiment. The horizontal axis represents an optical distance L between the surface position of the light emitting unit 230 and the surface position of the light receiving unit 116 (see FIG. 12). The left vertical axis represents the light coupling efficiency between the pixel 202 and the pixel 102. The right vertical axis represents a ratio between the light coupling efficiency with respect to a right under pixel 102 and the light coupling efficiency with respect to another pixel 102 adjacent to the right under pixel 102. In FIG. 13, plots with black rhombuses represents the light coupling efficiency between the pixel 202 and the pixel 102 right under the pixel 202 of interest. Plots with black squares represents the light coupling efficiency between the pixel 202 and the pixel 102 adjacent to the pixel 102 right under the pixel 202 of interest. Plots with black triangles represents the ratio between the light coupling efficiency with respect to the right under pixel 102 and the light coupling efficiency with respect to the adjacent pixel 102.

In the calculation in FIG. 13, it is assumed that the pitch of the pixels 102 and 202 is 19 μm and the effective opening diameter of the light emitting unit 230 and the light receiving unit 116 is 5 μm. In the calculation, however, influence of light shielding due to members provided outside the light emitting layer of the light emitting unit 230 (for example, the ring electrode 260 or the like) is ignored.

As illustrated in FIG. 13, the light coupling efficiency between the pixel 202 and the pixel 102 increases as the spacing between the readout circuit substrate 100 and the sensor substrate 200 decreases. It is therefore possible to realize desired characteristics even with the configuration in which no lens group is provided on the readout circuit substrate 100 by appropriately setting the spacing between the readout circuit substrate 100 and the sensor substrate 200 in accordance with a required light coupling efficiency.

For example, it is possible to suppress the incident amount of a light to the light receiving unit 116 of the adjacent pixel 102 relative to the incident amount of a light to the light receiving unit 116 of the right under pixel 102 below around 3.5% by setting the distance L between the readout circuit substrate 100 and the sensor substrate 200 to 5 μm or less. Unlike a color-type imaging device that detects a light of a visible light band, an imaging device that detects a light of a wavelength band above 1.0 μm is a so-called monochrome imaging device that has no filters whose transmission wavelength bands are different in accordance with pixels. Thus, for some applications, even when crosstalk to an adjacent pixel is around 3.5%, this may be acceptable for usage. In such a case, with a configuration with no lens being provided as with the present embodiment, a low cost imaging device may be realized. Moreover, if crosstalk to an adjacent pixel is allowed up to around 10%, the distance L between the readout circuit substrate 100 and the sensor substrate 200 may be expanded up to around 7 μm.

Note that while an application example to the imaging device according to the first to fourth embodiments has been illustrated in the present embodiment, the same configuration as that of the present embodiment may be applied to the imaging device according to the fifth embodiment.

As described above, according to the present embodiment, it is possible to reduce manufacturing cost in addition to obtain the advantages of the first to fourth embodiments.

Seventh Embodiment

Figure 14:
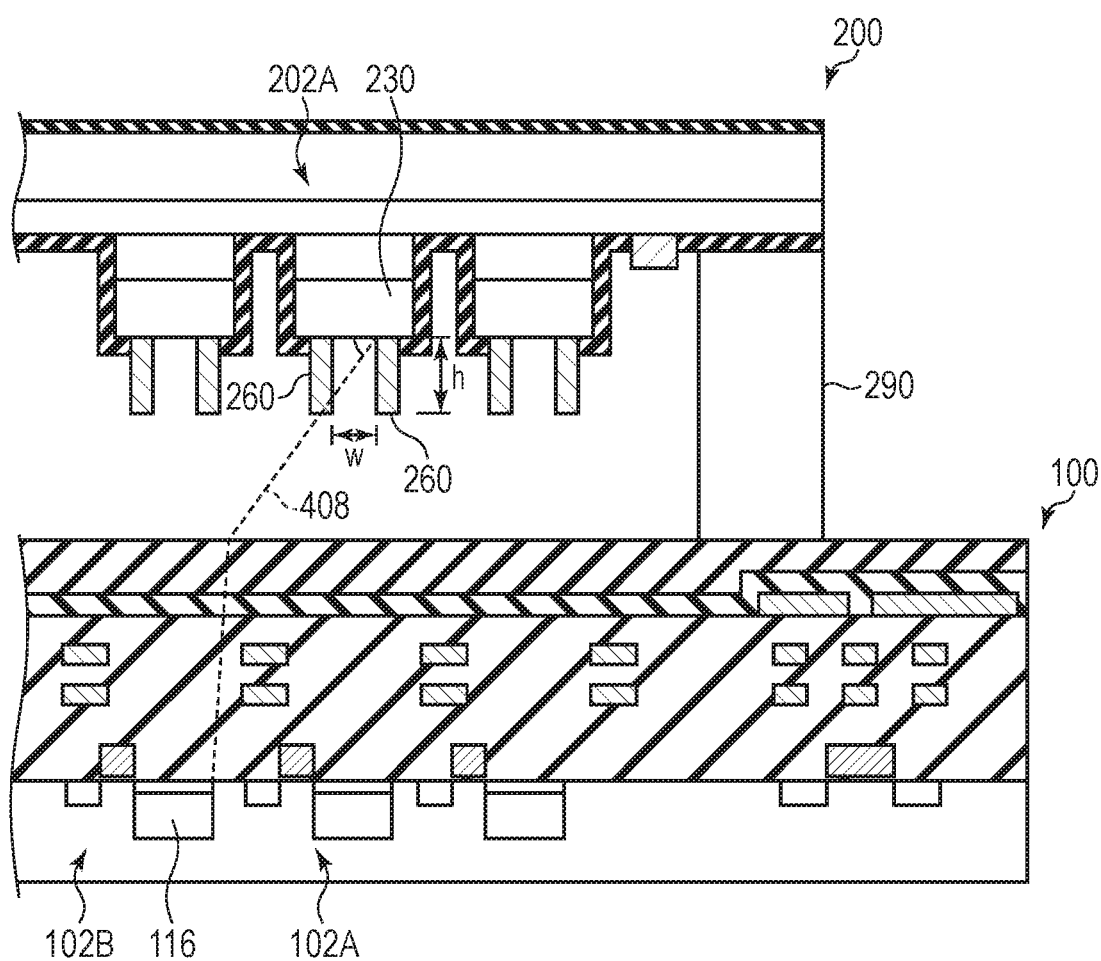
FIG. 14 is a schematic cross-sectional view illustrating the structure of an imaging device according to a seventh embodiment of the present invention.

An imaging device according to a seventh embodiment of the present invention will be described with reference to FIG. 14. Components similar to those of the imaging device according to the first to sixth embodiments are labeled with the same references, and the description thereof will be omitted or simplified. FIG. 14 is a schematic cross-sectional view illustrating the structure of an imaging device according to the present embodiment.

To reduce crosstalk to an adjacent pixel as described in the sixth embodiment, it is also effective to provide a light shield wall. For example, the ring electrode 260 may be utilized as such a light shield wall. In the present embodiment, in the imaging device according to the sixth embodiment, an example when the ring electrode 260 is used as a light shield wall will be described.

Here, it is considered that the region surrounded by the ring electrode 260 of the light emitting unit 230 corresponds to an opening from which a light is emitted. Further, as illustrated in FIG. 14, the ring electrode 260 that is higher than that in the case of the first to sixth embodiments is assumed, and a case where a light emitted from the light emitting unit 230 may transmit the ring electrode 260 is considered. In this situation, a light beam which passes through the highest portion of the ring electrode 260 out of a light beam that enters the light receiving unit 116 of the pixel 102B adjacent to the right under pixel 102A emitted from the light emitting unit 230 of the pixel 202A corresponds to a light beam 408 illustrated by a dotted line in FIG. 14.

Therefore, when the ring electrode 260 is used as a light shield wall, a light beam that enters the light receiving unit 116 of the pixel 102B adjacent to the right under pixel 102A may be effectively blocked when the height h of the ring electrode 260 (light shield wall) satisfies a relationship of Equation (3) below.

$$h > w \times \tan \theta 1 \quad (3)$$

Here, the value θ1 is an angle of the light beam 408 relative to the surface of the light emitting unit 230, and the value w is a width of the opening of the light emitting unit 230 (see FIG. 14).

For example, when the width w of the opening of the light emitting unit 230 is 5 μm the width of the opening of the light receiving unit 116 is 5 μm the optical distance between the surface of the light emitting unit 230 and the surface of the light receiving unit 116 is 5 μm and the pixel pitch is 19 μm the height h of a light shield wall that satisfies the relationship described above will be 1.3 μm.

The difference from the height of the light emission face of the light emitting unit 230 is important for the height of a light shield wall. Thus, a member as a light shield wall is not necessarily required to be provided up to the height. For example, it is possible to realize a light shield wall having the same effect also by etching a portion of the light emitting unit 230 from which a light is emitted by 0.5 μm and arranging the ring electrode 260 having a height of 0.8 μm around the portion. Further, the light shield wall satisfying Equation (3) is not necessarily required to be the ring electrode 260 but may be formed by using another member. Further, a light shield wall having the same function may be provided on the readout circuit substrate 100 side.

As described above, according to the present embodiment, it is possible to reduce crosstalk to an adjacent pixel in addition to obtain the advantage of the sixth embodiment.

Eighth Embodiment

Figure 15:
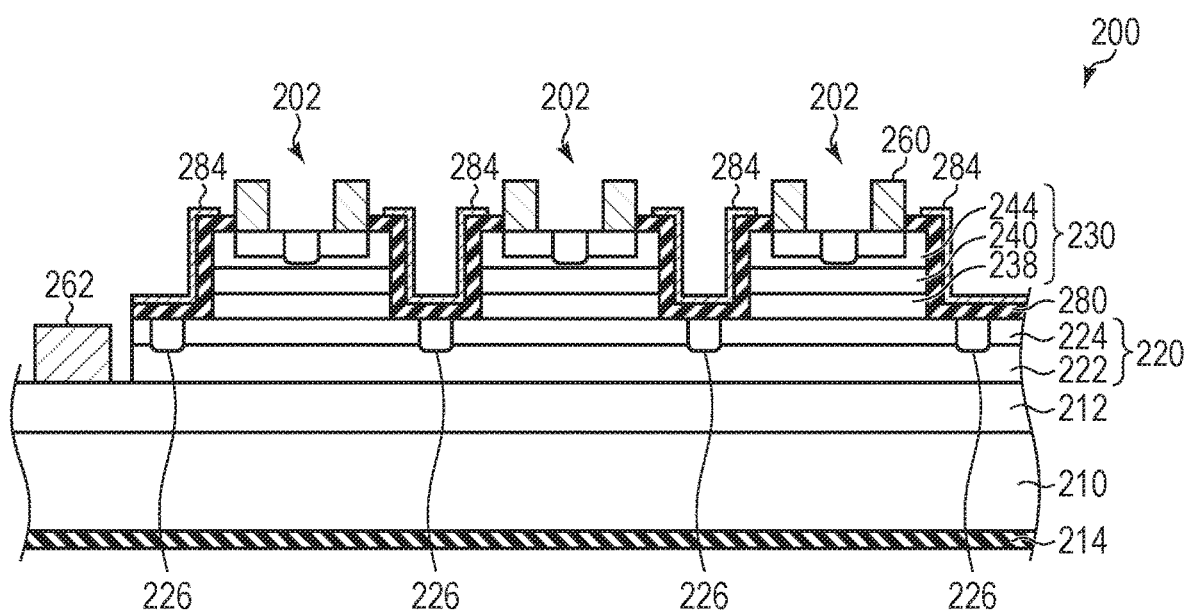
FIG. 15 is a schematic cross-sectional view illustrating the structure of a sensor substrate forming an imaging device according to an eighth embodiment of the present invention.

An imaging device according to an eighth embodiment of the present invention will be described with reference to FIG. 15. Components similar to those of the imaging device according to the first to seventh embodiments are labeled with the same references, and the description thereof will be omitted or simplified. FIG. 15 is a schematic cross-sectional view illustrating the structure of a sensor substrate forming an imaging device according to the present embodiment.

In the imaging device according to the first to seventh embodiments, each pixel 202 provided in the sensor substrate 200 is formed of a mesa structure including the light receiving unit 220 and the light emitting unit 230. In contrast, in the imaging device according to the present embodiment, as illustrated in FIG. 15, while the light emitting unit 230 has the independent mesa structure for each pixel 202, the undoped InGaAs layer 222 and the n-type InP layer 224 forming the light receiving unit 220 are not patterned for each pixel 202. A p-type region 226 is provided in the region between the pixels 202 in the n-type InP layer 224. The p-type region 226 is formed so as to surround the circumference of each pixel 202 in a plan view. The p-type region 226 is not particularly limited and may be formed by adding Zn to the n-type InP layer 224 by an ion implantation method, for example.

With the p-type region 226 being provided in the n-type InP layer 224, a p-n junction may be formed at the interface between the n-type InP layer 224 and the p-type region 226. By using a reverse direction property of this p-n junction, it is possible to electrically separate the light receiving unit 220 of the adjacent pixel 202.

In the configuration described above of the present embodiment, since the etching depth in forming a mesa structure is smaller than that in the case of the first to seventh embodiments in which a mesa structure including the light receiving unit 220 and the light emitting unit 230 is formed, a machining process may be easier. Further, since the light receiving unit 220 has no mesa structure, no surface current via a mesa side wall will flow.

Further, the imaging device according to the present embodiment further includes the light shield film 284 between the light emitting units 230 of the pixels 202 adjacent each other. The light shield film 284 is not particularly limited and may be formed of a stack film of a Cr film having a thickness of 10 nm and an Au film having a thickness of 100 nm, for example.

The reason why the light shield film 284 is provided in the imaging device according to the present embodiment is not to cause a light generated in the light emitting unit 230 of one pixel 202 to enter the light receiving unit 220 (the undoped InGaAs layer 222) of the adjacent pixel 202. This may suppress crosstalk of light between pixels 202.

The light shield film 284 is also applicable to the imaging devices according to the first to seventh embodiments. In the imaging devices according to the first to seventh embodiment, however, since the depth of a groove required for separating mesa structures of respective pixels 202 is deeper than that in the case of the present embodiment, relative difficulty in forming the light shield film 284 increases, as describe previously.

Note that, while an application example to the imaging device according to the third embodiment has been illustrated in the present embodiment, the same configuration as that of the present embodiment may be applied to the imaging device according to other embodiments.

As described above, according to the present embodiment, it is possible to facilitate a manufacturing process and reduce crosstalk to an adjacent pixel in addition to obtain the advantages of the first to seventh embodiments.

Ninth Embodiment

Figure 16:
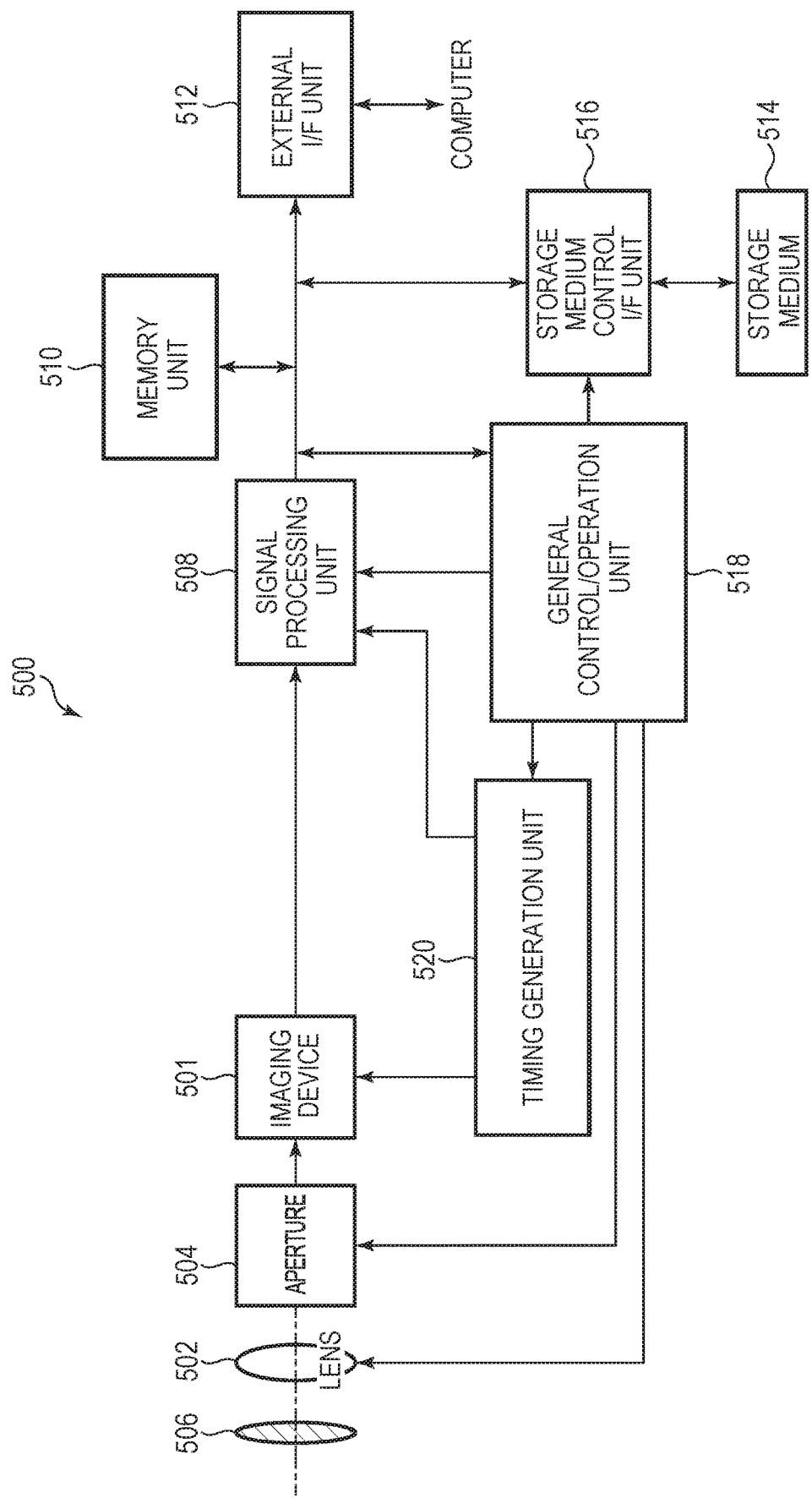
FIG. 16 is a block diagram illustrating a general configuration of an imaging system according to a ninth embodiment of the present invention.

An imaging system according to a ninth embodiment of the present invention will be described with reference to FIG. 16. Components similar to those of the imaging devices according to the first to eighth embodiments are labeled with the same references, and the description thereof will be omitted or simplified. FIG. 16 is a block diagram illustrating a general configuration of the imaging system according to the present embodiment.

The imaging device 300 described in the above first to eighth embodiments is applicable to various imaging systems. Examples of applicable imaging systems may include a digital still camera, a digital camcorder, a surveillance camera, a copying machine, a fax machine, a mobile phone, an on-vehicle camera, an observation satellite, and the like. In addition, a camera module including an optical system such as a lens and an imaging device is also included in the imaging system. FIG. 16 illustrates a block diagram of a digital still camera as an example out of these examples.

The imaging system 500 illustrated as an example in FIG. 16 includes an imaging device 501, a lens 502 that captures an optical image of a subject onto the imaging device 501, an aperture 504 for changing a light amount passing through the lens 502, and a barrier 506 for protecting the lens 502. The lens 502 and the aperture 504 form an optical system that converges a light onto the imaging device 501. The imaging device 501 is the imaging device 300 described in any of the first to eighth embodiments. The imaging device 501 transmits an optical image captured by the lens 502 on the pixel region 204 of the sensor substrate 200 to the readout circuit substrate 100 via the light receiving unit 220 and the light emitting unit 230 of each pixel 202. The readout circuit substrate 100 receives information transmitted from the sensor substrate 200 by each pixel 102 arranged in the pixel region 104 and converts the received information into an image signal.

The imaging system 500 further includes a signal processing unit 508 that processes an image signal output from the imaging device 501. The signal processing unit 508 preforms analog-to-digital (AD) conversion that converts an analog signal output by the imaging device 501 into a digital signal. In addition, the signal processing unit 508 performs various correction and compression other than the above, if necessary, and outputting image data. An AD converter unit, which is a part of the signal processing unit 508, may be provided on a semiconductor substrate on which the imaging device 501 is provided (the readout circuit substrate 100) or may be provided on a semiconductor substrate other than the substrate on which the imaging device 501 is provided. Further, the imaging device 501 and the signal processing unit 508 may be provided on the same semiconductor substrate.

The imaging system 500 further includes a memory unit 510 for temporarily storing image data therein and an external interface unit (external I/F unit) 512 for communicating with an external computer or the like. The imaging system 500 further includes a storage medium 514 such as a semiconductor memory for performing storage or readout of image data and a storage medium control interface unit (storage medium control I/F unit) 516 for performing storage or readout on the storage medium 514. Note that the storage medium 514 may be embedded in the imaging system 500 or may be removable.

The imaging system 500 further includes a general control/operation unit 518 that controls various operations and the entire digital still camera and a timing generation unit 520 that outputs various timing signals to the imaging device 501 and the signal processing unit 508. Here, the timing signal or the like may be input from the outside, and the imaging system 500 may include at least the imaging device 501 and the signal processing unit 508 that processes an output signal output from the imaging device 501.

The imaging device 501 outputs an image signal to the signal processing unit 508. The signal processing unit 508 performs predetermined signal processing on an image signal output from the imaging device 501 and outputs image data. The signal processing unit 508 generates an image by using the image data.

By applying the imaging device 300 according to the first to eighth embodiments, it is possible to realize an imaging system that may acquire a high definition image of a light of a long wavelength band such as above 1.0 μm.

Modified Embodiments

The present invention is not limited to the embodiments described above, and various modifications are possible.

For example, the material, the configuration, or the like illustrated in the embodiments described above may be appropriately changed as long as the advantage of the present invention is obtained. For example, in the embodiments described above, the pixel region 104 of the readout circuit substrate 100 may be configured to be the same as a backside irradiation type CMOS image sensor. Further, in the embodiments described above, an InGaAsSb-based material that may detect a light of a longer wavelength, an AlGaInN-based material that may effectively receive a light of an ultraviolet region, or a II-VI group compound semiconductor material may be applied to the light receiving unit 220 of the sensor substrate 200.

Further, while the readout circuit substrate 100 and the sensor substrate 200 are spaced apart by a predetermined spacing and an air layer (air gap) is interposed therebetween in the embodiments described above, a part between the readout circuit substrate 100 and the sensor substrate 200 is not necessarily an air layer (air gap). For example, a material transparent to a light emitted from the light emitting unit 230, for example, an optical transparent resin may be filled between the readout circuit substrate 100 and the sensor substrate 200. Further, the readout circuit substrate 100 and the sensor substrate 200 may be joined so that the surface of the readout circuit substrate 100 and the surface of the sensor substrate 200 are in contact with each other.

Further, a light shield member is provided so that no external light enters the light receiving unit 220 of some of the pixels 202 provided on the sensor substrate 200, and each of those pixels 202 may be a so-called optical black pixel that monitors a change amount of a dark current or the like due to a change in the surrounding temperature or the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

According to the present invention, it is possible to provide a high-performance and reliable imaging device and a high-performance and reliable imaging system that include a substrate provided with a light receiving unit and a substrate provided with a readout circuit.

What is claimed is:

1. An imaging device comprising: a first substrate in which a plurality of first pixels each including a first light receiving unit and a light emitting unit that emits light with a light amount in accordance with a light amount detected by the first light receiving unit are provided; and a second substrate that is provided facing the first substrate and in which a plurality of second pixels each including a second light receiving unit that detects a light emitted from the light emitting unit of the first pixel and a readout circuit that outputs an image signal based on information detected by the plurality of second pixels are provided, wherein the first light receiving unit and the light emitting unit comprising a plurality of compound semiconductor layers including a first compound semiconductor layer of a first conductivity type, a second compound semiconductor layer of a second conductivity type provided over the first compound semiconductor layer, and a third compound semiconductor layer of the first conductivity type provided over the second compound semiconductor layer is provided over the first substrate, and wherein a thickness of the second compound semiconductor layer is thicker than a thickness corresponding to a diffusion length of carriers of the first conductivity type in the second compound semiconductor layer.

2. The imaging device according to claim 1, wherein the plurality of compound semiconductor layers include a light receiving layer of the first light receiving unit provided between the first compound semiconductor layer and the second compound semiconductor layer and a light emitting layer of the light emitting unit provided between the second compound semiconductor layer and the third compound semiconductor layer, and wherein an energy band gap of a first compound semiconductor material forming the light receiving layer and an energy band gap of a second compound semiconductor material forming the light emitting layer are different from each other.

3. The imaging device according to claim 2, wherein the energy band gap of the second compound semiconductor material is larger than the energy band gap of the first compound semiconductor material.

4. The imaging device according to claim 1, wherein the plurality of compound semiconductor layers include an InP layer.

5. The imaging device according to claim 2, wherein an absorption wavelength band of a semiconductor material forming the second light receiving unit is on a longer wavelength side than an absorption wavelength band of the first compound semiconductor material.

6. The imaging device according to claim 5, wherein the semiconductor material is silicon.

7. The imaging device according to claim 1, wherein the first compound semiconductor layers of the plurality of first pixels and the third compound semiconductor layers of the plurality of first pixels are electrically connected, respectively.

8. The imaging device according to claim 1, wherein at least a part of the plurality of first pixels each include an individual electrode electrically connected to the second compound semiconductor layer.

9. The imaging device according to claim 1, wherein in the third compound semiconductor layer of each of the plurality of first pixels, an in-plane distribution is provided in impurities of the first conductivity type such that the light emitting unit locally, intensely emits light.

10. The imaging device according to claim 1,
wherein each of the plurality of first pixels further includes an electrode electrically connected to the third compound semiconductor layer, and
wherein the electrode functions as a light shield wall that prevents a light emitted from the light emitting unit of a first pixel from entering another second pixel that is different from a second pixel corresponding to the first pixel.

11. The imaging device according to claim 1 further comprising a first lens that is provided on the second substrate and converges light emitted from the light emitting unit on the second light receiving unit.

12. The imaging device according to claim 1 further comprising a second lens that is provided on the first substrate and converges light emitted from the light emitting unit on the second light receiving unit.

13. The imaging device according to claim 1, wherein each of the plurality of first pixels has a mesa structure in which at least the light emitting unit is independent of one another and includes a light shield film over a sidewall of the mesa structure.

14. The imaging device according to claim 1, wherein an air gap or a layer made of a material that is transparent to a light emitted from the light emitting unit is provided between the first substrate and the second substrate.

15. An imaging system comprising:
the imaging device according to claim 1; and
a signal processing unit that processes the image signal output from the imaging device.

16. An imaging device comprising: a first substrate in which a plurality of first pixels each including a first light receiving unit and a light emitting unit that emits light with a light amount in accordance with a light amount detected by the first light receiving unit are provided; and a second substrate that is provided facing the first substrate and in which a plurality of second pixels each including a second light receiving unit that detects a light emitted from the light emitting unit of the first pixel and a readout circuit that outputs an image signal based on information detected by the plurality of second pixels are provided, wherein the first light receiving unit and the light emitting unit comprising a plurality of compound semiconductor layers including a first compound semiconductor layer of a first conductivity type, a second compound semiconductor layer of a second conductivity type provided over the first compound semiconductor layer, and a third compound semiconductor layer of the first conductivity type provided over the second compound semiconductor layer is provided over the first substrate, wherein the second compound semiconductor layer includes an InP layer, and wherein a thickness of the second compound semiconductor layer is thicker than 5 µm.

17. An imaging device comprising: a first substrate in which a plurality of first pixels each including a first light receiving unit and a light emitting unit that emits light with a light amount in accordance with a light amount detected by the first light receiving unit are provided; and a second substrate that is provided facing the first substrate and in which a plurality of second pixels each including a second light receiving unit that detects a light emitted from the light emitting unit of the first pixel and a readout circuit that outputs an image signal based on information detected by the plurality of second pixels are provided, wherein the first light receiving unit and the light emitting unit comprising a plurality of compound semiconductor layers including a first compound semiconductor layer of a first conductivity type, a second compound semiconductor layer of a second conductivity type provided over the first compound semiconductor layer, and a third compound semiconductor layer of the first conductivity type provided over the second compound semiconductor layer is provided over the first substrate, and wherein the second compound semiconductor layer includes a blocking layer configured to suppress diffusion of minority carriers.

* * * * *